United States Patent
Xian et al.

(10) Patent No.: US 11,488,513 B2
(45) Date of Patent: Nov. 1, 2022

(54) SHIFT REGISTER UNIT, CIRCUIT STRUCTURE, GATE DRIVE CIRCUIT, DRIVE CIRCUIT AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Jianbo Xian, Beijing (CN); Chen Xu, Beijing (CN); Xueguang Hao, Beijing (CN); Yong Qiao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 379 days.

(21) Appl. No.: 16/475,513

(22) PCT Filed: Jan. 8, 2019

(86) PCT No.: PCT/CN2019/070895
§ 371 (c)(1),
(2) Date: Jul. 2, 2019

(87) PCT Pub. No.: WO2019/227939
PCT Pub. Date: Dec. 5, 2019

(65) Prior Publication Data
US 2021/0335195 A1    Oct. 28, 2021

(30) Foreign Application Priority Data
May 28, 2018  (CN) .......................... 201820809711.7

(51) Int. Cl.
G09G 3/3266    (2016.01)
G09G 3/20      (2006.01)

(52) U.S. Cl.
CPC ... *G09G 3/2092* (2013.01); *G09G 2300/0426* (2013.01); *G09G 2310/0286* (2013.01); *G09G 2310/061* (2013.01)

(58) Field of Classification Search
CPC ......... G09G 3/2092; G09G 2300/0426; G09G 2310/0286; G09G 2310/061;
(Continued)

(56) References Cited

U.S. PATENT DOCUMENTS 9,245,489 B2    1/2016 Han et al.
9,406,271 B2 *  8/2016 Yoon .................... G09G 3/3677
(Continued)

FOREIGN PATENT DOCUMENTS

CN    103578433 A    2/2014
CN    103632642 A    3/2014
(Continued)

OTHER PUBLICATIONS

International Search Report and Written Opinion dated Mar. 27, 2019; PCT/CN2019/070895.
(Continued)

*Primary Examiner* — Jose R Soto Lopez

(57) ABSTRACT

A shift register unit, a circuit structure, a gate drive circuit, a drive circuit and a display device are provided. A shift register unit includes a substrate and an input circuit, a reset circuit, a first output circuit, a first output terminal, a first connection conductive portion connecting both the input circuit and the reset circuit, a second connection conductive portion connecting both the reset circuit and the first output circuit, and a third connection conductive portion connecting both the first output circuit and the first output terminal, all of which are on the substrate.

15 Claims, 12 Drawing Sheets

(58) Field of Classification Search
CPC .... G09G 3/3674; G09G 3/3266; G09G 3/007; G09G 2310/0245; G11C 19/28
See application file for complete search history.

(56) References Cited

U.S. PATENT DOCUMENTS

| | | | | |
|---|---|---|---|---|
| 10,957,269 | B2* | 3/2021 | Park | G09G 3/3266 |
| 2005/0012873 | A1 | 1/2005 | Park et al. | |
| 2006/0001638 | A1* | 1/2006 | Jeon | G09G 3/3677 345/100 |
| 2010/0291722 | A1* | 11/2010 | Kim | C23F 1/26 252/79.3 |
| 2012/0056858 | A1* | 3/2012 | Ahn | G09G 3/3677 345/204 |
| 2012/0105393 | A1* | 5/2012 | Tan | G09G 3/3677 377/79 |
| 2012/0176299 | A1* | 7/2012 | Kang | G09G 3/3225 345/82 |
| 2013/0039455 | A1* | 2/2013 | Horiuchi | G09G 3/3677 377/64 |
| 2014/0159997 | A1* | 6/2014 | Chen | G09G 3/3677 345/87 |
| 2015/0070616 | A1* | 3/2015 | Ogasawara | G02F 1/1339 349/43 |
| 2015/0123136 | A1* | 5/2015 | Kim | H01L 27/1222 438/151 |
| 2015/0214247 | A1* | 7/2015 | Qin | H01L 27/1288 438/158 |
| 2017/0004760 | A1* | 1/2017 | Jang | G11C 19/28 |
| 2017/0032751 | A1* | 2/2017 | Jung | G02F 1/136286 |
| 2017/0139292 | A1* | 5/2017 | Yu | G09G 3/3648 |
| 2017/0162145 | A1 | 6/2017 | Huang et al. | |
| 2017/0185195 | A1 | 6/2017 | Kim et al. | |
| 2017/0193955 | A1* | 7/2017 | Kim | H01L 29/42384 |
| 2017/0219895 | A1* | 8/2017 | Yu | G09G 3/3688 |
| 2018/0129093 | A1* | 5/2018 | Hong | G02F 1/1345 |
| 2018/0129106 | A1* | 5/2018 | Gao | G09G 3/3648 |
| 2018/0204513 | A1* | 7/2018 | Fujita | G09G 3/3283 |
| 2018/0211620 | A1* | 7/2018 | Kurokawa | H01L 27/1251 |
| 2018/0336847 | A1* | 11/2018 | Chen | G02F 1/136286 |
| 2018/0364514 | A1* | 12/2018 | Liu | H01L 27/0288 |
| 2019/0058027 | A1* | 2/2019 | Kim | H01L 27/3262 |
| 2019/0064239 | A1* | 2/2019 | Lee | G01R 31/70 |
| 2019/0067218 | A1* | 2/2019 | Lin | G02F 1/136204 |
| 2019/0067404 | A1* | 2/2019 | Lee | H01L 51/5218 |
| 2019/0103455 | A1* | 4/2019 | Song | H01L 27/3265 |
| 2019/0131572 | A1* | 5/2019 | Gwon | H01L 51/5246 |
| 2019/0189075 | A1* | 6/2019 | Kim | H01L 27/0288 |
| 2019/0189681 | A1* | 6/2019 | Chae | H01L 25/0753 |
| 2019/0251921 | A1* | 8/2019 | Ono | G09G 3/20 |
| 2019/0305065 | A1* | 10/2019 | Kim | H01L 27/124 |
| 2020/0193928 | A1* | 6/2020 | Kawashima | H01L 27/1207 |
| 2020/0202779 | A1 | 6/2020 | Chang | |
| 2020/0251066 | A1* | 8/2020 | Hu | G09G 3/3677 |
| 2020/0342825 | A1* | 10/2020 | Kurokawa | G09G 3/20 |

FOREIGN PATENT DOCUMENTS

| | | |
|---|---|---|
| CN | 107170404 A | 9/2017 |
| CN | 107978293 A | 5/2018 |
| CN | 208141792 U | 11/2018 |
| KR | 20120046061 A | 5/2012 |

OTHER PUBLICATIONS

Korean Office Action dated Jan. 31, 2021; Appln. No. 10-2019-7037441.

Extended European Search Report dated Jan. 28, 2022; Appln. No. 19732243.1.

USPTO NFOA dated Sep. 15, 2022 in connection with U.S. Appl. No. 17/807,908.

* cited by examiner

US 11,488,513 B2

SHIFT REGISTER UNIT, CIRCUIT STRUCTURE, GATE DRIVE CIRCUIT, DRIVE CIRCUIT AND DISPLAY DEVICE

The present application claims priority of Chinese Patent Application No. 201820809711.7, filed on May 28, 2018, the disclosure of which is incorporated herein by reference in its entirety as part of the present application.

TECHNICAL FIELD

Embodiments of the present disclosure relate to a shift register unit, a circuit structure, a gate drive circuit, a drive circuit and a display device.

BACKGROUND

In the field of display technology, for example, a pixel array of a liquid crystal display panel generally includes rows of gate lines and columns of data lines that intersect with each other. The gate lines can be driven by a bonded integrated drive circuit. In recent years, with the continuous improvement of preparation processes of thin film transistors, a gate drive circuit can be directly integrated on a thin film transistor array substrate to form a GOA (Gate driver On Array) to drive the gate lines. For example, a GOA circuit including a plurality of cascaded shift register units can be used to provide on-off state voltage signals (scan signals) for the rows of gate lines of a pixel array, so as to control the rows of gate lines to be turned on sequentially.

SUMMARY

At least one embodiment of the present disclosure provides a shift register unit, which can flexibly select positions of connection conductive portions according to a distance between transistors, so as to avoid the connection conductive portions connecting respective transistors from being in a same layer, thereby simplifying the wiring design of a display panel and improving the accuracy of transmission of signals.

At least one embodiment of the present disclosure provides a shift register unit, which includes a substrate and an input circuit, a reset circuit, a first output circuit, a first output terminal, a first connection conductive portion connecting both the input circuit and the reset circuit, a second connection conductive portion connecting both the reset circuit and the first output circuit, and a third connection conductive portion connecting both the first output circuit and the first output terminal, all of which are on the substrate. The input circuit is configured to control a level of a first node in response to an input signal; the reset circuit is configured to reset the first node in response to a reset signal; the first output circuit is configured to output a first signal to the first output terminal under control of the level of the first node; and any two or three of the first connection conductive portion, the second connection conductive portion and the third connection conductive portion are in different layers.

For example, the shift register unit provided by an embodiment of the present disclosure further includes a first signal line input terminal and a fourth connection conductive portion. The fourth connection conductive portion connects the first output circuit and the first signal line input terminal, and the fourth connection conductive portion is configured to be in a layer different from any two or three of the first connection conductive portion, the second connection conductive portion and the third connection conductive portion.

For example, the shift register unit provided by an embodiment of the present disclosure further includes an output noise reduction circuit and a fifth connection conductive portion. The output noise reduction circuit is configured to perform noise reduction on the first output terminal under control of a level of a second node; and the fifth connection conductive portion connects the output noise reduction circuit and the first output circuit; and the fifth connection conductive portion is configured to be in a layer different from any two or three of the first connection conductive portion, the second connection conductive portion and the third connection conductive portion.

For example, the shift register unit provided by an embodiment of the present disclosure further includes a control circuit, a second signal line input terminal, and a sixth connection conductive portion. The control circuit is configured to control the level of the second node under control of the level of the first node and/or a second signal; and the sixth connection conductive portion is configured to connect the control circuit and the second signal line input terminal, and the sixth connection conductive portion is in a layer different from the fourth connection conductive portion.

For example, in the shift register unit provided by an embodiment of the present disclosure, a length of the first connection conductive portion is less than a length of the second connection conductive portion; or the first signal includes at least one of a clock signal, a voltage signal and a current signal.

At least one embodiment of the present disclosure further provides a circuit structure, which includes a substrate and a first transistor, a second transistor, a third transistor, a storage capacitor, a first output terminal, a first connection conductive portion, a second connection conductive portion, and a third connection conductive portion, which are on the substrate. The first connection conductive portion is configured to connect a first electrode of the first transistor and a first electrode of the second transistor; the second connection conductive portion is configured to connect the first electrode of the second transistor, a gate electrode of the third transistor and a first electrode of the storage capacitor; the third connection conductive portion is configured to connect the first output terminal and a first electrode of the third transistor; and any two or three of the first connection conductive portion, the second connection conductive portion and the third connection conductive portion are in different layers.

For example, the circuit structure provided by an embodiment of the present disclosure further includes a fourth transistor, a first signal line input terminal, a fourth connection conductive portion, and a fifth connection conductive portion. The fourth connection conductive portion is configured to connect a second electrode of the third transistor and the first signal line input terminal, and the fourth connection conductive portion is in a layer different from any two or three of the first connection conductive portion, the second connection conductive portion and the third connection conductive portion; and the fifth connection conductive portion is configured to connect the first electrode of the third transistor and a first electrode of the fourth transistor, and the fifth connection conductive portion is in a layer different from any two or three of the first connection conductive portion, the second connection conductive portion and the third connection conductive portion.

For example, the circuit structure provided by an embodiment of the present disclosure further includes a fifth transistor, a sixth transistor, a second signal line input terminal, and a sixth connection conductive portion. A first electrode of the fifth transistor is connected to a first electrode of the sixth transistor through the first connection conductive portion; and the sixth connection conductive portion is configured to connect a gate electrode of the sixth transistor and the second signal line input terminal, and the sixth connection conductive portion is in a layer different from the fourth connection conductive portion.

For example, in the circuit structure provided by an embodiment of the present disclosure, the first electrode of the third transistor and the second connection conductive portion are in a same layer; or, a material of the first connection conductive portion is identical to a material of a semiconductor layer of the first transistor.

For example, the circuit structure provided by an embodiment of the present disclosure further includes a seventh transistor, a third signal line input terminal, and a seventh connection conductive portion. A gate electrode of the seventh transistor is configured to be connected to the first output terminal to receive an output signal output by the first output terminal, a first electrode of the seventh transistor is configured to be connected to the third signal line input terminal through the seventh connection conductive portion to receive a third signal, and a second electrode of the seventh transistor is configured to be connected to a second output terminal; and in a case where the circuit structure includes a fourth connection conductive portion, the seventh connection conductive portion is configured to be in a layer different from the fourth connection conductive portion.

For example, the circuit structure provided by an embodiment of the present disclosure further includes an eighth transistor. A gate electrode of the eighth transistor is configured to be connected to a second node through the second connection conductive portion, a first electrode of the eighth transistor is configured to be connected to the second output terminal, and a second electrode of the eighth transistor is configured to be connected to a first voltage terminal to receive a first voltage.

At least one embodiment of the present disclosure further provides a gate drive circuit, which includes a plurality of cascaded shift register units provided by any one of embodiments of the present disclosure.

For example, the gate drive circuit provided by an embodiment of the present disclosure further includes a second output circuit, a third signal line input terminal, and a seventh connection conductive portion. The second output circuit is configured to output a third signal to a second output terminal under control of a level output by the first output terminal; and in a case where the shift register unit includes a fourth connection conductive portion, the seventh connection conductive portion is configured to connect the third signal line input terminal and the second output circuit, and the seventh connection conductive portion is in a layer different from the fourth connection conductive portion.

At least one embodiment of the present disclosure further provides a drive circuit, which includes a plurality of cascaded circuit structures provided by any one of embodiments of the present disclosure.

At least one embodiment of the present disclosure further provides a display device, which includes the gate drive circuit or circuit structures provided by any one of embodiments of the present disclosure. The gate drive circuit or the drive circuit is on four sides of an array substrate.

For example, the display device provided by an embodiment of the present disclosure further includes a first conductive layer, a second conductive layer, a third conductive layer, a fourth conductive layer, a fifth conductive layer, and a sixth conductive layer. A material of the first conductive layer is identical to a material of an active layer, a material of the second conductive layer is identical to a material of a first gate line layer, a material of the third conductive layer is identical to a material of a second gate line layer, a material of the fourth conductive layer is identical to a material of a first data line layer, a material of the fifth conductive layer is identical to a material of a second data line layer, and a material of the sixth conductive layer is identical to a material of a pixel electrode.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
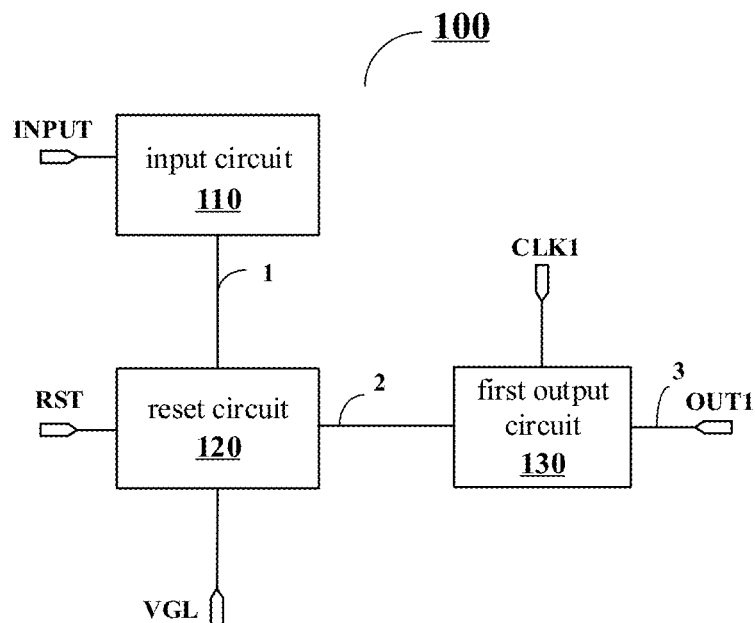
FIG. 1 is a schematic diagram of an example of a shift register unit provided by at least one embodiment of the disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Hereinafter, various embodiments of the present disclosure will be described in detail with reference to accompanying drawings. It should be noted that in the drawings, the same reference numerals denote components having substantially the same or similar structures and functions, and repeated descriptions thereof will be omitted.

In a display panel technology, in order to realize low cost and narrow bezel, a GOA (Gate driver On Array) technology can be adopted, i.e. a gate drive circuit is integrated on a display panel by a thin film transistor manufacturing process, thereby realizing advantages such as narrow bezel, reducing assembly cost and the like. Due to a large number of thin film transistors (TFT) in GOA and a connection manner that a plurality of TFTs are generally connected to each other through connection conductive portions made of the same material, for example, the plurality of connection conductive portions are formed by a same metal layer, the connection manner tends to complicate the connection relationships between the TFTs in a limited layout space of the display panel. In addition, because a distance between the connection conductive portions between the TFTs is short, the transmission of signals between the TFTs may be affected.

At least one embodiment of the present disclosure provides a shift register unit, which includes a substrate and an input circuit, a reset circuit, a first output circuit, a first output terminal, a first connection conductive portion connected to the input circuit and the reset circuit, a second connection conductive portion connected to the reset circuit and the first output circuit, and a third connection conductive portion connected to the first output circuit and the first output terminal, all of which are on the substrate. The input circuit is configured to control a level of a first node in response to an input signal; the reset circuit is configured to reset the first node in response to a reset signal; the first output circuit is configured to output a first signal to the first output terminal under control of the level of the first node; and any two or three of the first connection conductive portion, the second connection conductive portion and the third connection conductive portion are in different layers. At least one embodiment of the present disclosure further provides a circuit structure, a gate drive circuit and a display device.

The shift register unit provided by the embodiment of the present disclosure can flexibly select positions of connection conductive portions according to a distance between the transistors, so as to avoid all of the plurality of connection conductive portions connecting respective transistors from being in a same layer, thereby simplifying the wiring design of the display panel and improving the accuracy of the transmission of signals.

Hereinafter, embodiments of the present disclosure will be described in detail with reference to the accompanying drawings. It should be noted that the same reference numerals in different drawings will be used to refer to the same elements already described.

FIG. 1 is a schematic block diagram of an example of a shift register unit provided by an embodiment of the present disclosure. As shown in FIG. 1, the shift register unit 100 includes a substrate (not shown in FIG. 1), and an input circuit 110, a reset circuit 120, a first output circuit 130, and a first output terminal OUT1, all of which are on the substrate. For example, the shift register unit 100, as a component unit of a gate drive circuit, is formed on an array substrate of a display device. The array substrate includes the above substrate, and includes an array region (a display region) and a peripheral region. The gate drive circuit is formed in the peripheral region of the array substrate, and a plurality of pixel circuits are formed in the array region of the array substrate. The pixel circuit may include at least one transistor, such as a switching transistor, and may further include a component such as a driving transistor, for example. For example, thin film transistors in the array region and thin film transistors in the peripheral region can be obtained by a semiconductor manufacturing process.

As shown in FIG. 1, the shift register unit 100 further includes a first connection conductive portion 1 connecting both the input circuit 110 and the reset circuit 120, a second connection conductive portion 2 connecting both the reset circuit 120 and the first output circuit 130, and a third connection conductive portion 3 connecting both the first output circuit 130 and the first output terminal OUT1. For example, the third connection conductive portion 3 can be integrated with a gate line located in the array region of the array substrate, or the third connection conductive portion 3 can be electrically connected to the gate line located in the array region of the array substrate by via holes, connection lines, etc.

For example, the first connection conductive portion 1, the second connection conductive portion 2, and the third connection conductive portion 3 are on the substrate, and any two or three of the first connection conductive portion 1, the second connection conductive portion 2 and the third connection conductive portion 3 are in different layers. For example, the first connection conductive portion 1 and the second connection conductive portion 2 are in different layers, while the third connection conductive portion 3 can be in a same layer as any one of the first connection conductive portion 1 and the second connection conductive portion 2, or in a layer different from any one of the first connection conductive portion 1 and the second connection conductive portion 2. For another example, the first connection conductive portion 1, the second connection conductive portion 2, and the third connection conductive portion 3 are respectively in different layers, and the embodiments of the present disclosure are not limited to this case.

The embodiments of the present disclosure do not limit the number and the connection manner of the first connection conductive portion 1, the second connection conductive portion 2 and the third connection conductive portion 3. For example, the first connection conductive portion 1 indicates that there is at least one first connection conductive portion 1 for electrically connecting the input circuit 110 and the reset circuit 120, and the number and the connection manner of the first connection conductive portion 1 are not limited. That is, there is at least one first connection conductive portion 1 between at least one element of the input circuit 110 (e.g., a first electrode of a transistor in the input circuit 110) and the reset circuit 120 (e.g., a second electrode of a transistor in the reset circuit 120), so that the input circuit 110 and the reset circuit 120 are electrically connected to each other. The connection conductive portions of the following embodiments are the same as the above embodiments and will not be described again.

For example, a length of the first connection conductive portion is less than a length of the second connection conductive portion. For example, the length of a connection conductive portion represents an extension distance from a start terminal of the connection conductive portion to a stop terminal of the connection conductive portion, or represents an extension distance between via holes at the connection position of respective transistor elements in the circuit, so that the positions of the connection conductive portions can be flexibly selected according to the extension distance between respective transistors. The extension distance depends on the shape of the connection conductive portion (e.g., a line type, an S-type, etc.), rather than a linear distance between two terminals.

The input circuit 110 is configured to control a level of a first node (not shown in FIG. 1, see FIG. 3) in response to an input signal, for example, to charge the first node. For example, the first node is a junction point of the first connection conductive portion 1 and the second connection conductive portion 2, belongs to both the first connection conductive portion 1 and the second connection conductive portion 2, and does not represent an actual component. For example, the input circuit 110 can be connected to the input terminal INPUT and the first connection conductive portion 1 (i.e., the first node), respectively, and be configured to transmit a voltage signal received by the input circuit 110 to the first node. Specifically, the input circuit 110 can be configured to electrically connect the first node and the input terminal INPUT or an otherwise provided high voltage terminal under control of a signal input by the input terminal INPUT, so that a high-level signal input by the input terminal INPUT or a high-level signal input by a high voltage terminal of the input circuit 110 can charge the first node to increase the level of the first node, so that the level of the first node can control the first output circuit 130 to be turned on.

The reset circuit 120 is configured to reset the first node in response to a reset signal. For example, the reset circuit 120 can be configured to be connected to a reset terminal RST, the first connection conductive portion 1 (i.e., the first node), and the second connection conductive portion 2 (i.e., the first node), respectively, so that the first node can be applied with a low-level signal or electrically connected to a low-voltage terminal, such as a first voltage terminal VGL or a reference voltage terminal, under control of the reset signal input by the reset terminal RST, so that the first node can be pulled down and reset.

The embodiments of the present disclosure are described by taking N-type transistors as an example. It should be noted that the embodiments of the present disclosure are not limited to this case, and a circuit structure including P-type transistors or a mixture of N-type transistors and P-type transistors can also be adopted, and as long as a turned-on level of the corresponding P-type transistor is changed to a low level.

It should be noted that in the embodiments of the present disclosure, controlling a level of a node (e.g., the first node PU or a second node PD) including charging the node to pull up the level of the node, or discharging the node to pull down the level of the node. Charging a node means, for example, electrically connecting the node with a high-level voltage signal, thereby using the high-level voltage signal to pull up the level of the node; discharging the node means, for example, electrically connecting the node to a low-level voltage signal, thereby using the low-level voltage signal to pull down the lever of the node. For example, in some embodiments, a capacitor can be set to be electrically connected to the node, and charging or discharging the node means charging or discharging the capacitor electrically connected to the node.

In addition, it should be noted that in the embodiments of the present disclosure, the high level and the low level are described relatively. The high level represents a higher voltage range (for example, the high level can adopt 5V, 10V or other suitable voltage), and a plurality of high levels can be the same or different. Similarly, the low level represents a lower voltage range (for example, the low level can adopt 0V, −5V, −10V or other suitable voltage), and a plurality of low levels can be the same or different. For example, the minimum value of the high level is greater than the maximum value of the low level.

The first output circuit 130 is configured to output a first signal to the first output terminal OUT1 under control of the level of the first node. For example, the first signal includes a first clock signal or other voltage signal (e.g., a high-level signal). For example, the first output circuit 130 can be configured to be connected to the second connection conductive portion 2 (i.e., the first node), the third connection conductive portion 3 (i.e., the first output terminal OUT1), and a first signal line input terminal CLK1, respectively, so that the first clock signal input by the first signal line input terminal CLK1 or other voltage signal input to the first output circuit 130, as an output signal of the shift register unit 100, can be output to the first output terminal OUT1 under control of the level of the first node, and the output signal is input to other circuit structure connected to the first output circuit 130 (e.g., a second output circuit, which will be described in detail below). For example, the first output circuit 130 can be configured to be turned on under control of the level of the first node, and electrically connect the first signal line input terminal CLK1 and the first output terminal OUT1, so that the first signal, as the output signal of the shift register unit, input by the first signal line input terminal CLK1 can be output to the first output terminal OUT1.

It should be noted that the first signal includes at least one of a clock signal, a voltage signal or a current signal, and can be depended on the specific situation, and the embodiments of the present disclosure are not limited thereto. For example, the clock signal can be the first clock signal, and the voltage signal can be the first voltage (e.g., a low voltage), and also a second voltage (e.g., a high voltage, e.g., the first voltage is lower than the second voltage), or other reference voltage.

Figure 2:
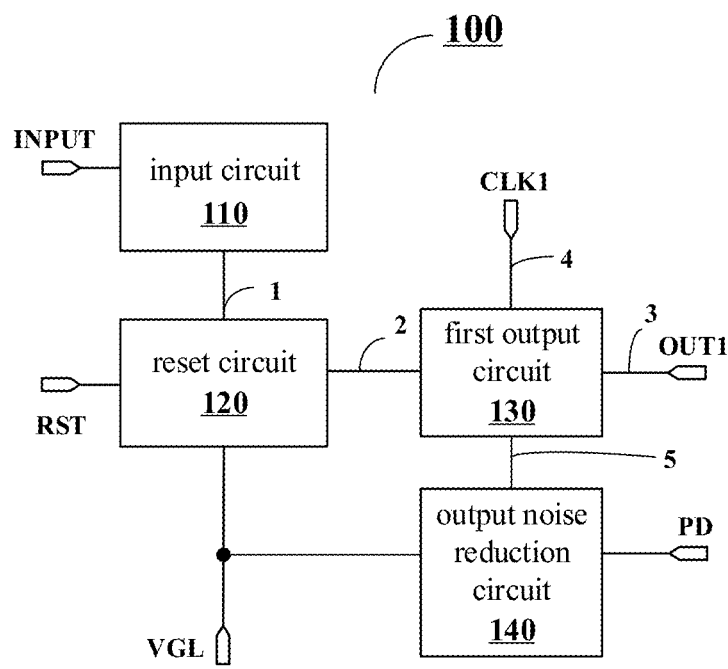
FIG. 2 is a schematic diagram of another example of a shift register unit provided by at least one embodiment of the disclosure.

FIG. 2 is a schematic diagram of another example of a shift register unit provided by an embodiment of the present disclosure. As shown in FIG. 2, on the basis of the example as shown in FIG. 1, the shift register unit 100 further includes a fourth connection conductive portion 4. The fourth connection conductive portion 4 is configured to connect the first output circuit 130 and the first signal line input terminal CLK1, and is in a layer different from any two or three of the first connection conductive portion 1, the second connection conductive portion 2 and the third connection conductive portion 3. For example, the fourth connection conductive portion 4 is in a layer different from both the first connection conductive portion 1 and the second connection conductive portion 2.

For example, as shown in FIG. 2, on the basis of the example as shown in FIG. 1, the shift register 100 further includes an output noise reduction circuit 140 and a fifth connection conductive portion 5. For example, the fifth connection conductive portion 5 is configured to connect the output noise reduction circuit 140 and the first output circuit 130, and is in a layer different from at least two of the first connection conductive portion 1, the second connection conductive portion 2 and the third connection conductive portion 3. For example, the fifth connection conductive portion 5 is in a layer different from both the first connection conductive portion 1 and the second connection conductive portion 2.

For example, the output noise reduction circuit 140 is configured to perform noise reduction on the first output terminal OUT1 under control of a level of the second node PD. For example, the output noise reduction circuit 140 can be configured to electrically connect the first output terminal OUT1 and the first voltage terminal VGL under control of the level of the second node PD, thereby pulling down the first output terminal OUT1 and performing noise reduction on the first output terminal OUT1. For example, the second node PD can be connected to a signal line input terminal or other circuit that can generate a level controlling the output noise reduction circuit 140, and the embodiments of the present disclosure are not limited thereto. For example, the output noise reduction circuit 140 can further be configured to electrically connect the first output terminal OUT1 and the first voltage terminal VGL or other fixed voltage signal under control of the level of the second node PD, thereby pulling down the first output terminal OUT1 and performing noise reduction on the first output terminal OUT1.

Figure 3:
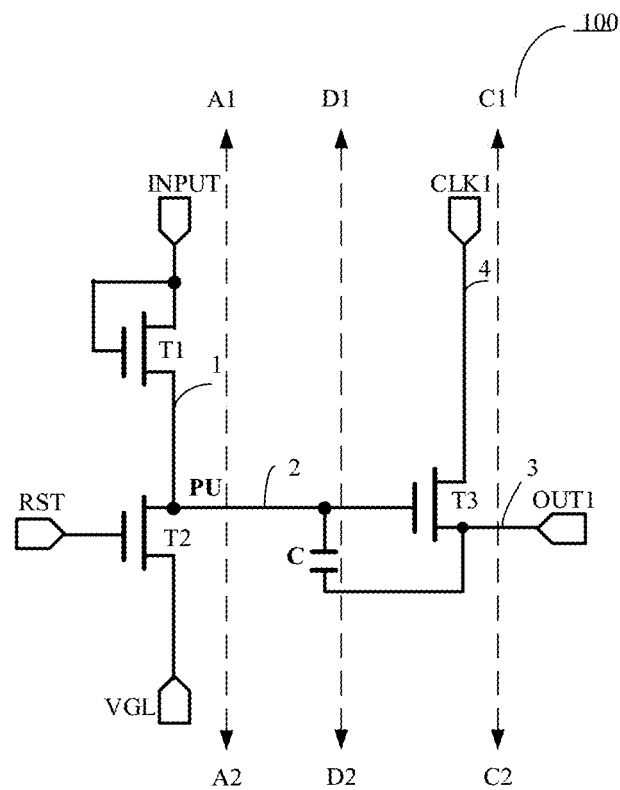
FIG. 3 is a circuit schematic diagram of an implementation example of the shift register unit as shown in FIG. 1.

FIG. 3 is a circuit schematic diagram of an implementation example of the shift register unit as shown in FIG. 1. In the following description, respective transistors are illustrated by taking a case that respective transistors are N-type transistors as an example, but the embodiments of the present disclosure are not limited to this case, respective transistors can also be P-type transistors. The N-type transistor can use oxide as an active layer of the thin film transistor, for example, use indium gallium zinc oxide (IGZO) as the active layer of the thin film transistor, and can also use polysilicon (for example, low-temperature polysilicon LTPS or high-temperature polysilicon HTPS) or amorphous silicon (for example, hydrogenated amorphous silicon) as the active layer of the thin film transistor. The active layer using indium gallium zinc oxide (IGZO) can effectively reduce the size of the transistor and prevent leakage current.

As shown in FIG. 3, the shift register unit 100 includes a first transistor T1 to a third transistor T3 and a storage capacitor C.

Figure 7:
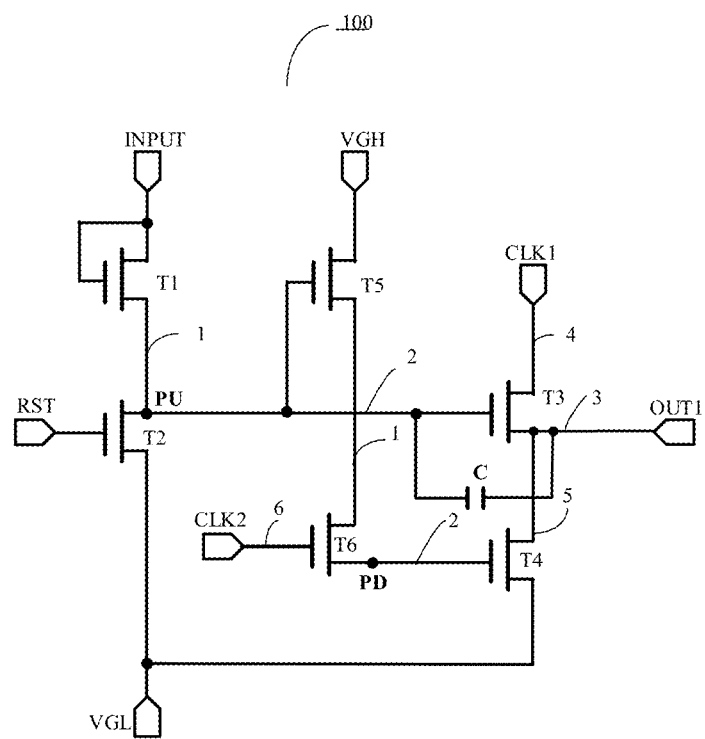
FIG. 7 is a circuit schematic diagram of an implementation example of the shift register unit as shown in FIG. 6.

The input circuit 110 can be implemented as a first transistor T1. A gate electrode of the first transistor T1 and a first electrode of the first transistor T1 are electrically connected to each other, and both are configured to be connected to the input terminal INPUT to receive the input signal, and a second electrode of the first transistor T1 is configured to be connected to the first node PU (i.e., a first electrode of a second transistor) through the first connection conductive portion 1, so that in a case where the first transistor T1 is turned on under control of a turned-on signal (a high-level signal) received by the input terminal INPUT, the turned-on signal is used to charge the first node PU so that the first node PU is at a high level. It can be understood that the gate electrode of the first transistor T1 or the first electrode of the first transistor T1 can be configured to connect at least one of a clock signal, a second voltage terminal VGH or other fixed voltage signals or a combination thereof. For example, the gate electrode of the first transistor T1 is connected to the first signal line input terminal CLK1 to receive the clock signal, and the first electrode of the first transistor T1 is connected to the second voltage terminal VGH to receive a second voltage. In addition, in the connection relationships of other respective transistors, in a case where a first electrode of an transistor is connected to a first electrode of another transistor, different portions of the first connection conductive portion (it should be noted that these different portions are independent to each other or electrically connected to each other as required) can be used for connecting the first electrode of the transistor and the first electrode of the another transistor. For example, a first electrode of the fifth transistor T5 can be connected to a first electrode of the sixth transistor T6, as shown in FIG. 7, by the first connection conductive portion 1, and the other connection conductive portions can also be connected in this way. The following embodiments are the same as the embodiment and will not be described again.

The reset circuit 120 can be implemented as a second transistor T2. A gate electrode of the second transistor T2 is configured to be connected to the reset terminal RST to receive the reset signal, a first electrode of the second transistor T2 is configured to be connected to the first node PU through the first connection conductive portion 1, and a second electrode of the second transistor T2 is configured to be connected to the first voltage terminal VGL to receive the first voltage. In a case where the second transistor T2 is turned on under control of the reset signal, the first node PU can be electrically connected to the first voltage terminal VGL, so that the first node PU can be reset by the first voltage (for example, a low-level voltage), thereby causing the level of the first node PU to be pulled down to a low level.

The output circuit 130 can be implemented as a third transistor T3. A gate electrode of the third transistor T3 is configured to be connected to the first node PU through the second connection conductive portion 2, a first electrode of the third transistor T3 is configured to be connected to the first signal line input terminal CLK1 to receive the first signal, and a second electrode of the third transistor T3 is configured to be connected to the first output terminal OUT1 through the third connection conductive portion 3.

Figure 10A:
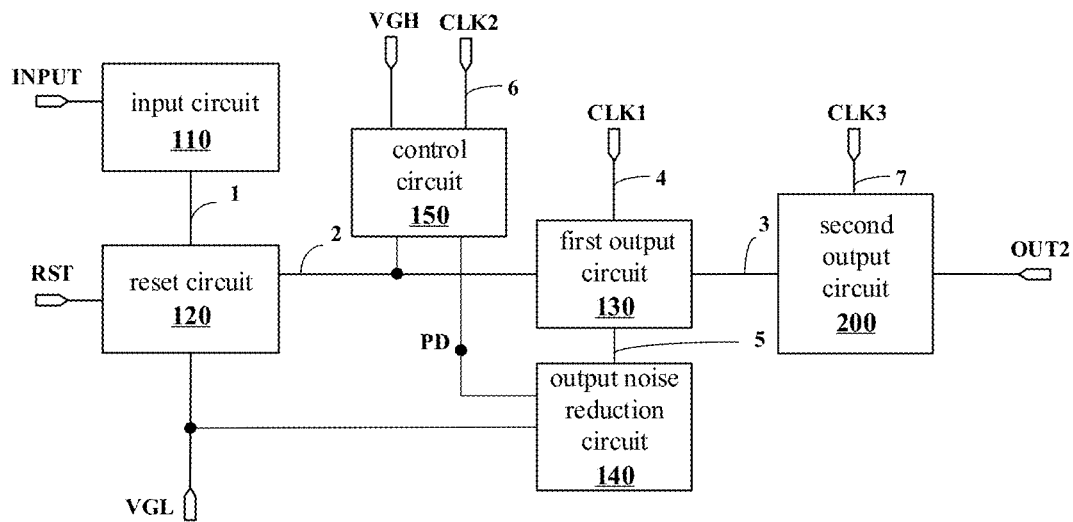
FIG. 10A is a schematic block diagram of the gate drive circuit as shown in FIG. 9B or the gate drive circuit as shown in FIG. 9C.
Figure 10B:
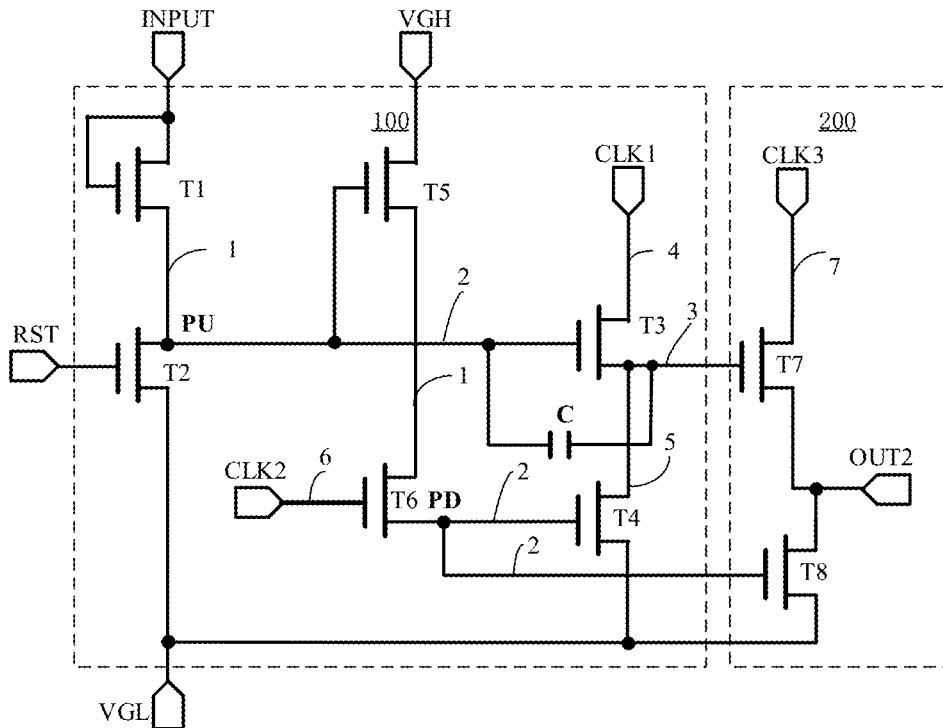
FIG. 10B is a circuit schematic diagram of an implementation example of the gate drive circuit as shown in FIG. 10A.

The storage capacitor C can be a part of the output circuit 130. Of course, the storage capacitor C can also be an independent element of the shift register unit 100. Or both the storage capacitor C and other elements form an integral part of the shift register unit 100. For example, a second electrode of the storage capacitor C is configured to be connected to the first output terminal OUT1 through the third connection conductive portion 3, and a first electrode of the storage capacitor C is configured to be connected to the gate electrode of the third transistor T3. Or, the first electrode of the storage capacitor C is configured to be connected to the second connection conductive portion 2, and the second electrode of the storage capacitor C is connected to the clock signal terminal. For example, the first electrode of the storage capacitor C is in a transparent conductive layer, the second electrode of the storage capacitor C is in a first data line layer or a gate line layer, and the embodiments of the present disclosure do not limited to this case. For example, in another example, the first electrode of the third transistor T3 is configured to be connected to the first signal line input terminal CLK1 through the fourth connection conductive portion 4 to receive the first signal. For example, in the connection relationships of other respective transistors, in a case where a first electrode of an transistor or a second electrode of the transistor is connected to a gate electrode of another transistor, different portions of the second connection conductive portion 2 (it should be noted that these different portions are independent to each other or electrically connected to each other as required) can be used for connecting the first electrode of the transistor or a second electrode of the transistor and the gate electrode of the another transistor. For example, as shown in FIG. 10B, a second electrode of a sixth transistor T6 can be connected to a gate electrode of a fourth transistor T4 through the second connection conductive portion 2, and the second electrode of the sixth transistor T6 can be connected to a gate electrode of an eighth transistor T8 through the second connection conductive portion 2.

Figure 4A:
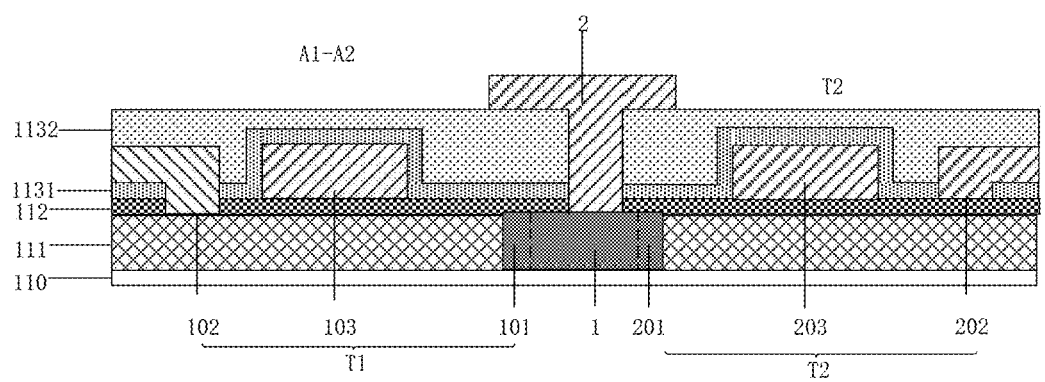
FIG. 4A is a cross-sectional structural schematic diagram of an array substrate taken along a line A1-A2 as shown in FIG. 3.

FIG. 4A is a cross-sectional structural schematic diagram of an array substrate, in which the shift register unit is located, taken along a line A1-A2 as shown in FIG. 3. As shown in FIG. 4A, along the line A1-A2 as shown in FIG. 3, the first transistor T1 includes a first electrode 101, a second electrode 102, a gate electrode 103, an active layer 111, and the like. The second transistor T2 includes a first electrode 201, a second electrode 202, a gate electrode 203, the active layer 111, and the like.

For example, the first electrode 101 of the first transistor T1 is connected to the first electrode 201 of the second transistor T2 through the first connection conductive portion 1. For example, a start terminal of the first connection conductive portion 1 is a region corresponding to the first electrode (e.g., a drain electrode) of the first transistor T1, and a stop terminal of the first connection conductive portion 1 is a region corresponding to the first electrode (e.g., a source electrode) of the second transistor T2. As shown in FIG. 4A, the first connection conductive portion 1 includes the first electrode 101 (e.g., the drain electrode) of the first transistor T1 and the first electrode 201 (e.g., the source electrode) of the second transistor T2, that is, the first connection conductive portion 1 is integrally formed with the first electrode 101 of the first transistor T1 and the first electrode 201 of the second transistor T2. It should be noted that the first electrode 101 (e.g., the drain electrode) of the first transistor T1 and the first electrode 201 (e.g., the source electrode) of the second transistor T2 can also be separately formed, and then electrically connected to the first connection conductive portion 1 by via holes, overlapping, or integrally formed, etc. The embodiments of the present disclosure are not limited thereto. The first electrode 101 of the first transistor T1 overlaps to the active layer of the first transistor T1 to establish an electrical connection, for example. Similarly, the first electrode 201 of the second transistor T2 overlaps to the active layer of the second transistor T2 to establish an electrical connection, for example. For example, the first connection conductive portion 1 includes a conductive portion of an active layer between the first transistor T1 and the second transistor T2.

As shown in FIG. 4A, along a direction of the line A1-A2 as shown in FIG. 3, the shift register unit further includes the second connection conductive portion 2 connected to the first connection conductive portion 1. As shown in FIG. 4A, the first connection conductive portion 1 and the second connection conductive portion 2 are in different layers. As shown in FIG. 4A, the first connection conductive portion 1 is in a same layer as the active layer 111 of the first transistor T1 and the active layer 111 of the second transistor T2, and the second connection conductive portion 2 is formed on a second passivation layer 1132 and electrically connected to the first connection conductive portion 1 through a via hole in the second passivation layer 1132, a first passivation layer 1131 and a gate insulating layer 112. For example, the first connection conductive portion 1 is located in a first conductive layer 11 as shown in FIG. 4D, the second connection conductive portion 2 is located in a fourth conductive layer 14 as shown in FIG. 4D, the gate insulating layer 112 corresponds to a first insulating layer 21 as shown in FIG. 4D, the first passivation layer 1131 corresponds to a second insulating layer 22 as shown in FIG. 4D, and the second passivation layer 1132 corresponds to a third insulating layer 23 as shown in FIG. 4D. For example, as shown in FIG. 4A, a terminal (e.g., a start terminal) of the second connection conductive portion 2 is formed between the gate electrode of the first transistor T1 and the gate electrode of the second transistor T2. For example, the second connection conductive portion 2 and the gate electrode of the third transistor T3 (not shown in the figure) are electrically connected or integrally formed with each other, and the embodiments of the present disclosure are not limited thereto.

Figure 4B:
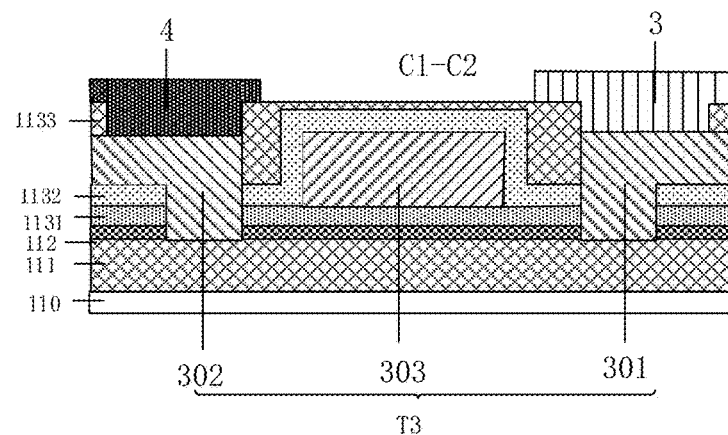
FIG. 4B is a cross-sectional structural schematic diagram of an array substrate taken along a line C1-C2 as shown in FIG. 3.

FIG. 4B is a cross-sectional structural schematic diagram of the array substrate taken along a line C1-C2 as shown in FIG. 3. As shown in FIG. 4B, along a direction of the line C1-C2 as shown in FIG. 3, the third transistor T3 includes a first electrode 301, a second electrode 302, a gate electrode 303, the active layer 111, and the like. For example, the gate electrode 303 of the third transistor, the gate electrode 103 of the first transistor and the gate electrode 203 of the second transistor are in different layers, and for example, the gate electrode 303 of the third transistor is formed on the first passivation layer 1131. As shown in FIG. 4B, the first electrode 301 of the third transistor T3 and the second electrode 302 of the third transistor T3 are electrodes which are separately formed. For example, the first electrode 301 of the third transistor T3 and the second electrode 302 of the third transistor T3 are formed on the second passivation layer 1132 and are connected to the active layer through a via hole in the second passivation layer 1132, the first passivation layer 1131 and the gate insulating layer 112. For example, an aspect ratio of the first transistor T1 is less than an aspect ratio of the third transistor T3, for example, the aspect ratio of the third transistor T3 is 3-50 times the aspect ratio of the first transistor T1, for example, the aspect ratio of the first transistor T1 is 0.6-1.2, and the aspect ratio of the third transistor T3 is 3-30. For example, the first electrode (e.g., a drain electrode) of the third transistor T3 and the second connection conductive portion 2 (as shown in FIG. 2) are in a same layer.

As shown in FIG. 4B, the shift register unit further includes a third connection conductive portion 3. For example, the first electrode 301 of the third transistor T3 is electrically connected to the third connection conductive portion 3, and is connected to the first output terminal OUT1 through the third connection conductive portion 3. It should be noted that the first electrode 301 of the third transistor T3 and the third connection conductive portion 3 can be integrally formed, whereby the first electrode 301 of the third transistor T3 and the third connection conductive portion 3 can be formed into a same layer, and the embodiments of the present disclosure are not limited to this case.

For example, as shown in FIG. 4B, the third connection conductive portion 3 is formed on the third passivation layer 1133, and is connected to the first electrode 301 of the third transistor T3 through an via hole. Because the first electrode (e.g., the drain electrode) of the third transistor T3 is in a same layer as the second connection conductive portion 2, the third connection conductive portion 3 is in a layer different from the second connection conductive portion 2, while the third connection conductive portion 3 is in a layer different from the first connection conductive portion 1, so that the connection conductive portions connecting respective transistors can be avoided from being in a same layer, thereby simplifying the wiring design of the display panel and improving the accuracy of the transmission of signals. It should be noted that as long as any two or three of the first connection conductive portion 1, the second connection conductive portion 2 and the third connection conductive portion 3 are in different layers, the embodiments of the present disclosure are not limited thereto.

As shown in FIG. 4B, in an example, the shift register unit further includes a fourth connection conductive portion 4. For example, the fourth connection conductive portion 4 is formed on the third passivation layer 1133, and is connected to the second electrode 302 of the third transistor T3 through an via hole. The fourth connection conductive portion 4 is connected to the first signal line input terminal CLK1 to receive the first signal. It should be noted that the second electrode 302 of the third transistor T3 and the fourth connection conductive portion 4 can be integrally formed, and the embodiments of the present disclosure are not limited to this case. For example, in the example, the third connection conductive portion 3 and the fourth connection conductive portion 4 are in a same layer, and are in a layer different from the first connection conductive portion 1 and the second connection conductive portion 2. It should be noted that as long as the fourth connection conductive portion 4 is in a layer different from any two or three of the first connection conductive portion 1, the second connection conductive portion 2 and the third connection conductive portion 3, and the embodiments of the present disclosure are not limited to this case. It can be understood that a passivation layer, for example, the first passivation layer 1131 or the second passivation layer 1132, can also be between the second connection conductive portion 2 and the gate electrode 103 of the first transistor.

Figure 4C:
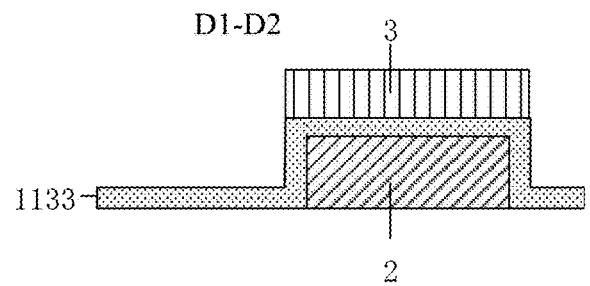
FIG. 4C is a cross-sectional structural schematic diagram of an array substrate taken along a line D1-D2 as shown in FIG. 3.
Figure 4D:
FIG. 4D is a cross-sectional structural schematic diagram of a conductive layer where each connection conductive portion, provided by at least one embodiment of the disclosure, is located.

FIG. 4C is a cross-sectional structural schematic diagram of the array substrate taken along a line D1-D2 as shown in FIG. 3. As shown in FIG. 4C, the second connection conductive portion 2 and the third connection conductive portion 3 form a storage capacitor C along a direction of the line D1-D2 as shown in FIG. 3. As shown in FIG. 4C, a third passivation layer 1133 is formed on the second connection conductive portion 2, and the third connection conductive portion 3 is formed on the third passivation layer 1133. For example, the material used for forming the first passivation layer 1131, the second passivation layer 1132 and the third passivation layer 1133 includes inorganic insulating material such as SiNx, SiOx, or SiNxOy, organic insulating material such as organic resin, or other suitable material, and the embodiments of the present disclosure are not limited thereto.

It should be noted that the cross-sectional diagrams of the transistors and the connection conductive portions on the array substrate in the following embodiments are similar to the cross-sectional diagram of the transistors and the connection conductive portions as shown in FIGS. 4A-4C, and details will not be repeated here.

For example, as shown in FIG. 4D, the array substrate sequentially includes a plurality of layer structures from bottom to top, including but not limited to the first conductive layer 11, the first insulating layer 21, the second conductive layer 12, the second insulating layer 22, the third conductive layer 13, the third insulating layer 23, the fourth conductive layer 14, a fourth insulating layer 24, a fifth conductive layer 15, a fifth insulating layer 25, a sixth conductive layer 16, and the like. For example, a material of the first conductive layer 11 is the same as a material of the active layer, a material of the second conductive layer 12 is the same as a material of the first gate line layer, a material of the third conductive layer 13 is the same as a material of the second gate line layer, a material of the fourth conductive layer 14 is the same as a material of the first data line layer, a material of the fifth conductive layer 15 is the same as a material of the second data line layer, and a material of the sixth conductive layer 16 is the same as a material of the pixel electrode. For example, conductive layers which are located in different layers but connected to each other can be electrically connected through via holes (not shown in FIG. 4D). Of course, other structures can also be included under the first conductive layer 11. Each of the above conductive layers can include at least a portion of conductive structure.

Referring to FIGS. 4A, 4B, 4C and 4D, the first connection conductive portion 1 is located in the first conductive layer 11. For example, a material of the first connection conductive portion 1 is the same as a material of a semiconductor layer of the first transistor. For example, the first connection conductive portion 1 is formed by conducting a part of the structure of the semiconductor layer. For example, the semiconductor layer can be a conductive portion of the active layer. The gate electrode 103 of the first transistor T1 and the gate electrode 203 of the second transistor T2 are located in the second conductive layer 12 or the third conductive layer 13, the gate electrode 303 of the third transistor T3 is located in the third conductive layer 13 or the second conductive layer 12, the second connection conductive portion 2 is located in the fourth conductive layer 14, the third connection conductive portion 3 is located in the fifth conductive layer 15, and the fourth connection conductive portion 4 is also located in the fifth conductive layer 15. It should be noted that the embodiments of the present disclosure include but are not limited to this case, as long as any two or three of the first connection conductive portions 1, the second connection conductive portions 2 and third connection conductive portions 3 are not in a same conductive layer, and the fourth connection conductive portion 4 is in a conductive layer different from any two or three of the first connection conductive portions 1, the second connection conductive portions 2 and third connection conductive portions 3, the embodiments of the present disclosure are not limited to this case. For example, the material of the first conductive layer 11 to the sixth conductive layer 16 include aluminum, aluminum alloy, copper, copper alloy, or any other suitable material, and the embodiments of the present disclosure are not limited thereto. It should be noted that the number of conductive layers and insulating layers can depend on specific circumstances, and the embodiments of the present disclosure are not limited thereto.

Referring to FIGS. 4A, 4B, 4C and 4D, the gate insulating layer 112 is located in the first insulating layer 21, the first passivation layer 1131 is located in the second insulating layer 22, the second passivation layer 1132 is located in the third insulating layer 23, and the third passivation layer 1133 is located in the fourth insulating layer 24.

For example, the first conductive layer 11 can include a conductive active layer, the second conductive layer 12 can be a layer where the gate electrodes of the transistors are located, the third conductive layer 13 can be a first transparent conductive layer (e.g., including the first electrode of the storage capacitor C or the gate electrode of the third transistor T3), the fourth conductive layer 14 can be the first data line layer, the fifth conductive layer 15 can be the second data line layer, and the sixth conductive layer 16 can be a second transparent conductive layer. For example, the first data line layer (e.g., the fourth conductive layer) and the second data line layer (e.g., the fifth conductive layer) can include a connection conductive portion connected to a signal line input terminal, and the embodiments of the present disclosure are not limited thereto. For example, a material of the first transparent conductive layer and a material of the second transparent conductive layer include transparent metal oxide such as indium tin oxide (ITO) or indium zinc oxide (IZO), and the transparent conductive layer can be in a same layer with the pixel electrode. For example, the conductive active layer includes polysilicon doped with conductive impurities, an oxide semiconductor (e.g., IGZO), etc. It should be noted that the material of each conductive layer depends on the specific situation, and the embodiments of the present disclosure are not limited to this case.

For example, as shown in FIG. 4A and FIG. 4B, the material of the active layer 111 included by all of the first transistor T1, the second transistor T2 and the third transistor T3 can include an oxide semiconductor, an organic semiconductor, or a polysilicon semiconductor, etc. For example, the oxide semiconductor includes a metal oxide semiconductor (e.g., indium gallium zinc oxide (IGZO)), and the polysilicon semiconductor includes a low-temperature polysilicon semiconductor or a high-temperature polysilicon semiconductor, etc., and the embodiments of the present disclosure are not limited thereto.

For example, the material of all of the first electrode 101 of the first transistor T1, the second electrode 102 of the first transistor T1, the gate electrode 103 of the first transistor T1, the first electrode 201 of the second transistor T2, the second electrode 202 of the second transistor T2 and the gate electrode 203 of the second transistor T2 can include aluminum, aluminum alloy, copper, copper alloy, or any other suitable material, and the embodiments of the present disclosure are not limited thereto.

For example, as shown in FIG. 4A and FIG. 4B, the first connection conductive portion 1 to the fourth connection conductive portion 4 are formed in different layers on the substrate 110, so that the positions of the connection conductive portions can be flexibly selected according to the extension distance between the transistors, and the connection conductive portions connecting the respective transistors are avoided from being in a same layer, thereby simplifying the wiring design of the display panel and improving the accuracy of the transmission of signals.

The substrate 110 can be a glass substrate, a quartz substrate, a plastic substrate, or a substrate made of other suitable material. For example, the material of the gate insulating layer 112 includes inorganic insulating material such as SiNx and SiOx, organic insulating material such as organic resin, or other suitable material, and the embodiments of the present disclosure are not limited thereto.

It should be noted that the above embodiments are described by taking a transistor with a top gate structure as an example, and are not limited to this case. Transistors with any other structure (e.g., a bottom gate structure) can also be applied, and the embodiments of the present disclosure are not limited to this case. The following examples are the same as the embodiment and will not be described again.

Figure 5:
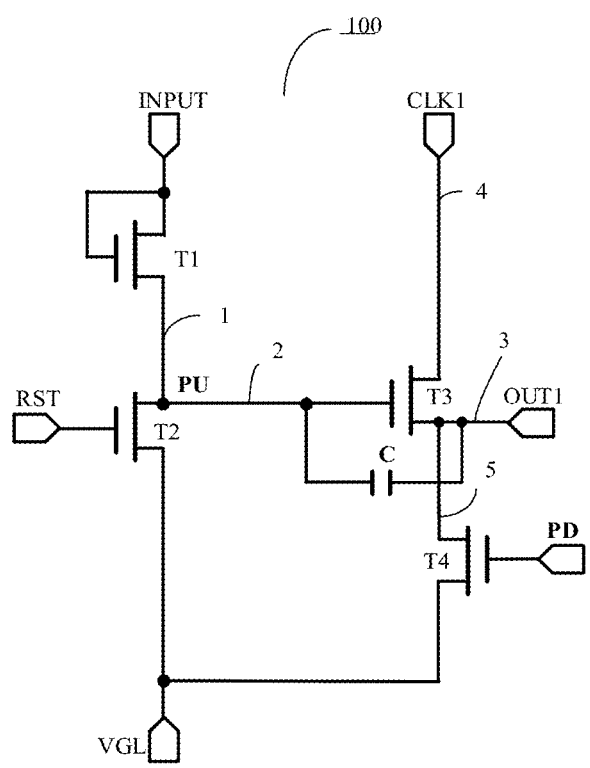
FIG. 5 is a circuit schematic diagram of an implementation example of the shift register unit as shown in FIG. 2.

FIG. 5 is a circuit schematic diagram of an implementation example of the shift register unit as shown in FIG. 2. As shown in FIG. 5, on the basis of the example as shown in FIG. 3, the shift register unit 100 further includes a fourth transistor.

For example, the output noise reduction circuit 140 can be implemented as a fourth transistor T4. A gate electrode of the fourth transistor T4 is connected to the second node PD, a first electrode of the fourth transistor T4 is connected to the first output terminal OUT1 through the fifth connection conductive portion 5, and a second electrode of the fourth transistor T4 is connected to the first voltage terminal VGL to receive the first voltage. The fourth transistor T4 is turned on in a case where the second node PD is at an effective level (e.g., a high level), thereby electrically connecting the first output terminal OUT1 and the first voltage terminal VGL, so that the first output terminal OUT1 can be denoised by the first voltage (e.g., a low-level voltage).

Figure 6:
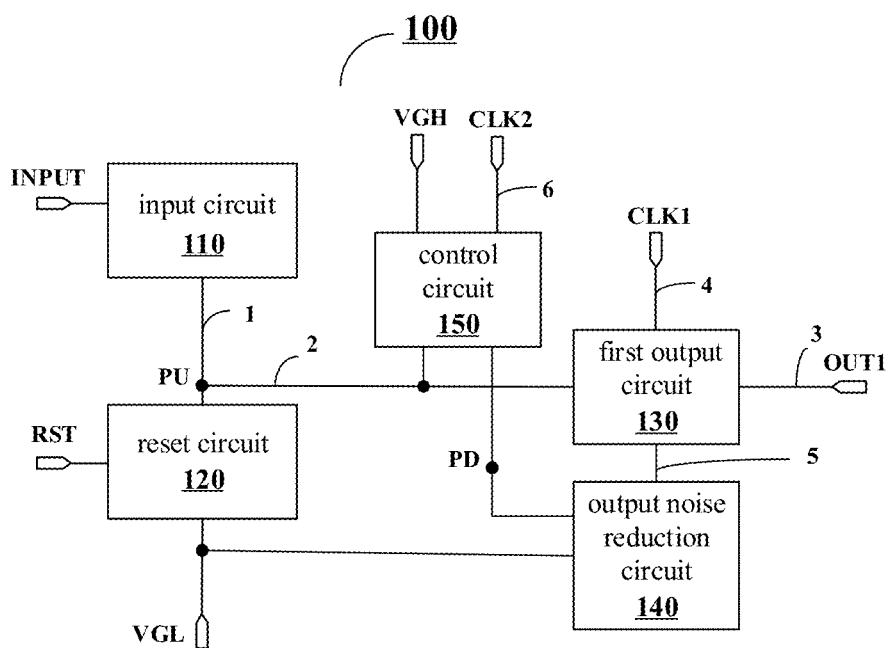
FIG. 6 is a schematic diagram of yet another example of a shift register unit provided by at least one embodiment of the disclosure.

FIG. 6 is a schematic diagram of another example of a shift register unit provided by an embodiment of the present disclosure. As shown in FIG. 6, based on the example as shown in FIG. 2, the shift register unit 100 further includes a control circuit 150, a second signal line input terminal CLK2, and a sixth connection conductive portion 6. For example, the sixth connection conductive portion 6 is configured to connect the control circuit 150 and the second signal line input terminal CLK2, and is in a layer different from the fourth connection conductive portion 4. For example, in a case where the fourth connection conductive portion 4 is in the fifth conductive layer 15 as shown in FIG. 4D, the sixth connection conductive portion 6 can be in the first data line layer (the fourth conductive layer 14) or in other layer except the layer where the fifth conductive layer 15 (i.e., the fourth connection conductive portion 4) is located, thus avoiding that the connection conductive portions connecting the respective transistors being in a same layer, thus simplifying the wiring design of the display panel and improving the accuracy of the transmission of signals. The embodiments of the present disclosure are not limited to this case.

The control circuit 150 is configured to control a level of the second node PD under control of the level of the first node PU and the second signal, thereby realizing the control of the output noise reduction circuit 140. For example, the control circuit 150 can be respectively connected to the first voltage terminal VGL, the second voltage terminal VGH, the first node PU and the second node PD to electrically connect the second node PD and the second voltage terminal VGH under control of the level of the first node PU and a level of the second signal, thereby controlling the level of the second node PD, for example, charging the second node PD, so that the second node PD is at a high level.

FIG. 7 is a circuit schematic diagram of an implementation example of the shift register unit as shown in FIG. 6. As shown in FIG. 7, on the basis of the example as shown in FIG. 5, the shift register unit 100 further includes a fifth transistor T5 and a sixth transistor T6.

For example, the control circuit 150 can be implemented as the fifth transistor T5 and the sixth transistor T6. For example, a gate electrode of the fifth transistor T5 is configured to be connected to the first node PU, a first electrode is configured to be connected to the second voltage terminal VGH to receive the second voltage, and a second electrode of the fifth transistor is configured to be connected to a first electrode of the sixth transistor T6 through the first connection conductive portion 1. A gate electrode of the sixth transistor T6 is configured to be connected to the second signal line input terminal CLK2 to receive the second signal through the sixth connection conductive portion 6, and a second electrode of the sixth transistor T6 is configured to be connected to the second node PD.

Figure 8:
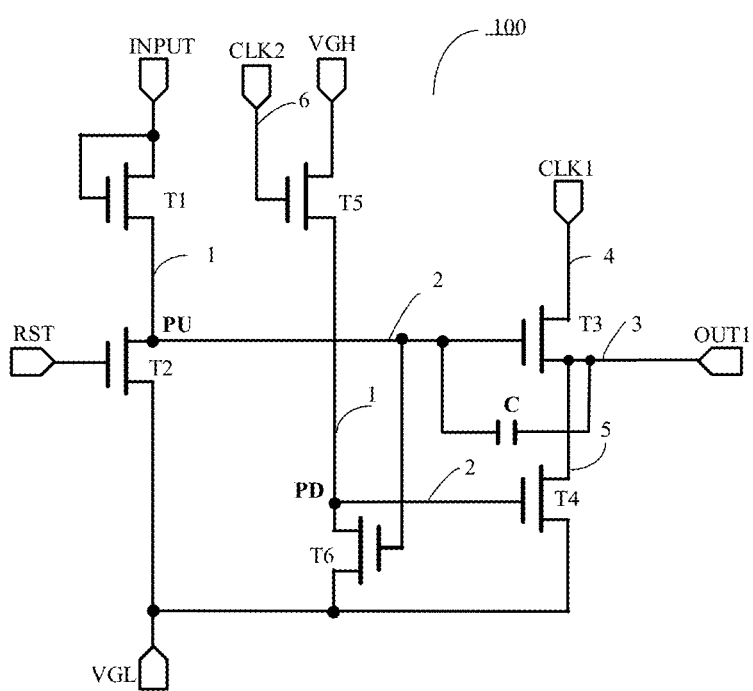
FIG. 8 is a circuit schematic diagram of another implementation example of the shift register unit as shown in FIG. 6.

FIG. 8 is a circuit schematic diagram of another implementation example of the shift register unit as shown in FIG. 6. As shown in FIG. 8, on the basis of the example as shown in FIG. 5, the shift register unit 100 further includes a fifth transistor T5 and a sixth transistor T6.

For example, the control circuit 150 can be implemented as the fifth transistor T5 and the sixth transistor T6. For example, a gate electrode of the fifth transistor T5 is configured to be connected to the second signal line input terminal CLK2 to receive the second signal through the sixth connection conductive portion 6, a first electrode of the fifth transistor T5 is configured to be connected to the second voltage terminal VGH to receive the second voltage, and a second electrode of the fifth transistor T5 is configured to be connected to a first electrode of the sixth transistor T6 through the first connection conductive portion 1. A gate electrode of the sixth transistor T6 is configured to be connected to the first node PU, and a second electrode of the sixth transistor T6 is configured to be connected to the first voltage terminal VGL, so that the level of the second node PD can be controlled, thereby controlling the output noise reduction circuit 140 to perform noise reduction on the first output terminal OUT1.

It should be noted that the control unit 150 can also be implemented as other circuit structure, and the embodiments of the present disclosure are not limited to this case.

It should be noted that, in the embodiments of the present disclosure, the first voltage terminal VGL is configured to, for example, keep inputting a DC low-level signal, which is referred to the first voltage; the second voltage terminal VGH is configured to, for example, keep inputting a DC high-level signal, which is referred to the second voltage. The following embodiments are the same as the embodiment and will not be described again.

It should be noted that the transistors used in the embodiments of the present disclosure may all be thin film transistors or field effect transistors or other switching devices with the like characteristics, and the embodiments of the present disclosure can be described by taking the thin film transistors as an example. A source electrode and a drain electrode of each transistor used here can be symmetrical in structure, so the source electrode and the drain electrode of the transistor can be structurally indistinguishable. In the embodiments of the present disclosure, in order to distinguish the two electrodes of the transistor except a gate electrode, one of the two electrodes is referred to as a first electrode described directly, and the other is referred to as a second electrode.

In addition, the transistors in the embodiments of the present disclosure are all described by taking an N-type transistor as an example. In this case, a first electrode of each transistor is the drain electrode, and a second electrode of the transistor is the source electrode. It should be noted that the present disclosure includes but is not limited to this case. For example, one or more transistors in the shift register unit 100 provided by the embodiments of the present disclosure may also adopt P-type transistors. In this case, a first electrode of each transistor is the source electrode, a second electrode of the transistor is the drain electrode, and as long as polarities of the respective electrodes of selected-type transistors correspondingly be connected in accordance with the polarities of the respective electrodes of the respective transistors in the embodiment of the present disclosure. For example, the turned-on level of the P-type transistor is a low level. It should be noted that the embodiments of the present disclosure includes but is not limited to this case. The shift register unit 100 can also adopt a mixture of P-type transistors and N-type transistors, and as long as polarities of the respective terminals of the selected-type transistors correspondingly be connected in accordance with the port polarities of the corresponding transistors in the embodiments of the present disclosure.

The shift register unit provided by the embodiment of the present disclosure can flexibly select the positions of the connection conductive portions according to the extension distance between the transistors, so as to avoid that all of the connection conductive portions connecting the respective transistors from being in a same layer, thereby simplifying the wiring design of the display panel and improving the accuracy of the transmission of signals.

At least on embodiment of the present disclosure further provides a circuit structure. The circuit structure is, for example, a shift register unit or a part of the shift register unit. As shown in FIG. 3, the circuit structure includes a substrate (not shown in FIG. 3) and a first transistor T1, a second transistor T2, a third transistor T3, a storage capacitor C, a first output terminal OUT1, a first connection conductive portion 1, a second connection conductive portion 2, and a third connection conductive portion 3, all of which are on the substrate. For example, any two or three of the first connection conductive portion 1, the second connection conductive portion 2 and the third connection conductive portion 3 are in different layers.

The first connection conductive portion 1 is configured to connect a first electrode of the first transistor T1 and a first electrode of the second transistor T2.

The second connection conductive portion 2 is configured to connect the first electrode of the second transistor T2, a gate electrode of the third transistor T3 and a first electrode of the storage capacitor.

The third connection conductive portion 3 is configured to connect the first output terminal OUT1 and a first electrode of the third transistor T3.

For example, the connection relationships between the transistors in the example is similar to the connection relationships between the transistors of the shift register unit as shown in FIG. 3, and details will not be repeated here.

In another example, as shown in FIG. 5, on the basis of the example as shown in FIG. 3, the circuit structure can further include a fourth transistor T4, a first signal line input CLK1, a fourth connection conductive portion 4, and a fifth connection conductive portion 5.

The fourth connection conductive portion 4 is configured to connect a second electrode of the third transistor T3 and the first signal line input terminal CLK1, and is in a layer different from any two or three of the first connection conductive portion 1, the second connection conductive portion 2 and the third connection conductive portion 3. Of course, the first signal line input terminal can also be the second voltage terminal VGH or the first voltage terminal VGL.

The fifth connection conductive portion 5 is configured to connect the first electrode of the third transistor T3 and the first electrode of the fourth transistor T4, and is in a layer different from any two or three of the first connection conductive portion 1, the second connection conductive portion 2, and the third connection conductive portion 3.

For example, the connection relationships between the respective transistors in the example are similar to the connection relationships between the respective transistors of the shift register unit as shown in FIG. 5, and details will not be repeated here.

In yet another example, for example, on the basis of the example as shown in FIG. 5, the circuit structure further includes a five transistor T5, a sixth transistor T6, a second signal line input terminal CLK2, and a sixth connection conductive portion 6. The sixth connection conductive portion 6 is configured to connect a gate electrode of the sixth transistor T6 and the second signal line input terminal CLK2, and is in a layer different from the fourth connection conductive portion 4.

For example, a first electrode of the fifth transistor T5 is connected to a first electrode of the sixth transistor T6 through the first connection conductive portion 1.

For example, the connection relationships between the respective transistors in the example are similar to the connection relationships between the respective transistors of the shift register unit as shown in FIG. 7, and details will not be repeated here.

For example, as shown in FIG. 10B, on the basis of the circuit structure as shown in FIG. 7, the circuit structure can further include a seventh transistor, a third signal line input terminal, and a seventh connection conductive portion 7. For example, a gate electrode of the seventh transistor T7 is configured to be connected to the first output terminal OUT1 to receive the output signal output by the first output terminal, a first electrode of the seventh transistor T7 is configured to be connected to the third signal line input terminal CLK3 to receive a third signal through the seventh connection conductive portion 7, and a second electrode of the seventh transistor T7 is configured to be connected to the second output terminal OUT2. For example, in a case where the circuit structure includes the fourth connection conductive portion 4, the seventh connection conductive portion 7 is configured to be in a layer different from the fourth connection conductive portion 4.

For example, in another example, the circuit structure can further include an eighth transistor T8. For example, a gate electrode of the eighth transistor T8 is configured to be connected to the second node PD in the circuit structure through the second connection conductive portion 2, a first electrode of the eighth transistor T8 is configured to be connected to the second output terminal OUT2, and a second electrode of the eighth transistor T8 is configured to be connected to the first voltage terminal VGL to receive the first voltage.

It can be understood that all of the first signal, the second signal and the third signal mentioned in the embodiments of the present disclosure can be at least one of a clock signal, a voltage signal, or a current signal, which are depended on the specific situation, and the embodiments of the present disclosure are not limited to this case. For example, the clock signal can be a first clock signal, the voltage signal can be the first voltage (e.g., a low voltage), can also be the second voltage (e.g., a high voltage, e.g., the first voltage is lower than the second voltage), or other reference voltage. For example, the first signal is the voltage signal, the second signal and the third signal are clock signals.

The circuit structure provided in the embodiment of the present disclosure can flexibly select the positions of the connection conductive portions according to the extension distance between the transistors, so as to avoid that all of the connection conductive portions connecting the respective transistors from being in a same layer, thereby simplifying the wiring design of the display panel and improving the accuracy of the transmission of signals.

Figure 9A:
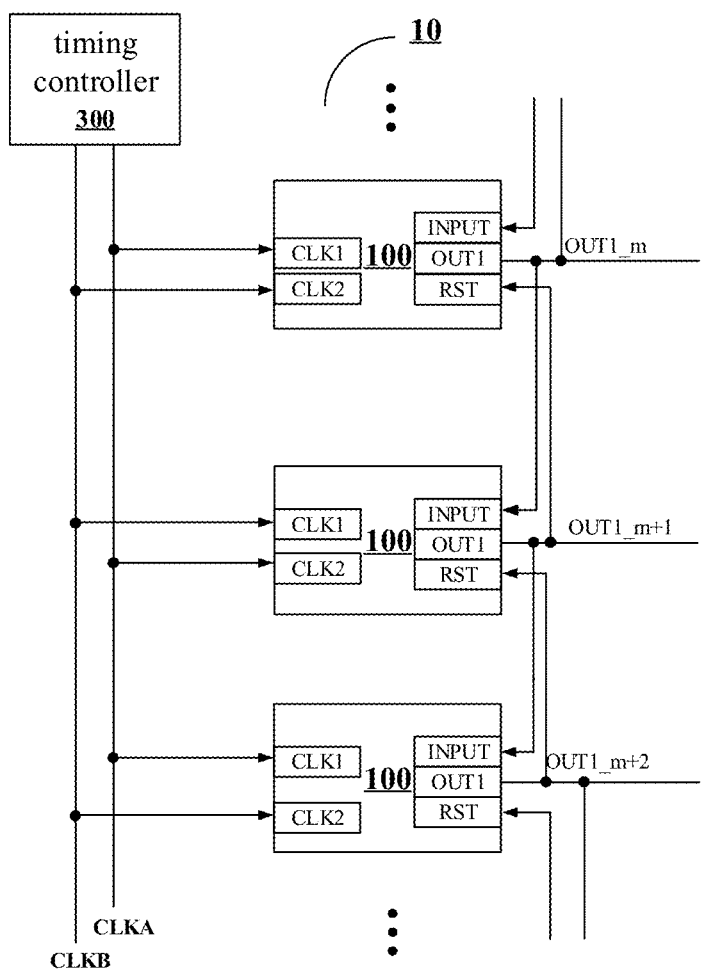
FIG. 9A is a schematic diagram of an example of a gate drive circuit provided by at least one embodiment of the disclosure.

FIG. 9A is a schematic diagram of a gate drive circuit according to an embodiment of the present disclosure. As shown in FIG. 9A, the gate drive circuit 10 includes a plurality of cascaded shift register units 100, a first signal line CLKA and a second signal line CLKB. For example, each of the shift register units 100 can adopt a circuit structure as shown in FIG. 7 provided by an embodiment of the present disclosure. It should be noted that the gate drive circuit 10 can also include four, six, eight or more clock signal lines. The number of clock signal lines depends on the specific situation, and the embodiments of the present disclosure are not limited to this case.

For example, as shown in FIG. 9A, each of the shift register units further includes a first signal line input terminal CLK1 and a second signal line input terminal CLK2, and is configured to be connected to a first signal line CLKA or a second signal line CLKB to receive the first signal or the second signal. The first signal line CLKA is connected to a first signal line input terminal CLK1 of a (2m−1)th-stage (m is an integer greater than 0) of the shift register units, the second signal line CLKB is connected to a second signal line input terminal CLK2 of the (2m−1)th-stage of the shift register units, the second signal line CLKB is connected to a first signal line input terminal CLK1 of a (2m)th-stage of the shift register units, and the first signal line CLKA is connected to a second signal line input terminal CLK2 of the (2m)th-stage (m is an integer greater than 0) of the shift register units. The embodiments of the present disclosure include but are not limited to this case.

It should be noted that, as shown in FIG. 9A, OUT1_$m$ represents a first output terminal of an (m)th-stage of the shift register units, OUT1_$m$+1 represents a first output terminal of an (m+1)th-stage of the shift register units, and OUT1_$m$+2 represents a first output terminal of an (m+2)th-stage of the shift register units. The reference numerals in the following embodiments are similar to the embodiment and will not be repeated here.

For example, as shown in FIG. 9A, except for a last-stage of the shift register units, a reset terminal RST of any one of the shift register units of other stages is connected to a first output terminal OUT1 of a shift register unit of a next stage after the any one of the shift register units of other stages. Except for a first-stage of the shift register units 100, an input terminal INPUT of any one of the shift register units of other stages is connected to a first output terminal OUT1 of a shift register unit of a preceding stage before the any one of the shift register units of other stages.

For example, an input terminal INPUT of the first-stage of the shift register units can be configured to receive a trigger signal STV, a reset terminal RST of the last-stage of the shift register units can be configured to receive a reset signal RESET, and the trigger signal STV and the reset signal RESET are not shown in FIG. 9A.

For example, as shown in FIG. 9A, the gate drive circuit 10 can further include a timing controller 300. For example, the timing controller 300 can be configured to be connected to the first signal line CLKA and the second signal line CLKB to provide the first signal and the second signal to each of the shift register units 100. For example, the timing controller 300 can further be configured to provide the trigger signal STV and the reset signal RESET.

Figure 11A:
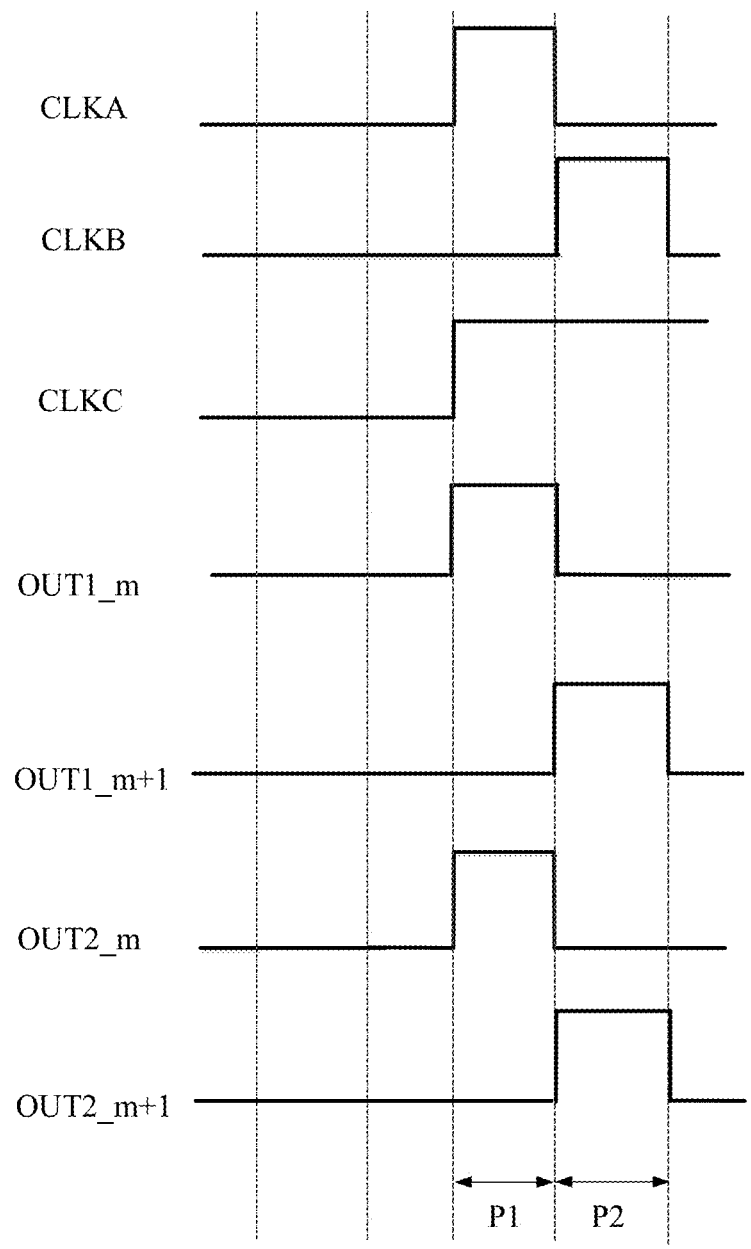
FIG. 11A is a signal timing chart corresponding to an operation process of the gate drive circuit as shown in FIG. 9B.

For example, the signal timing provided by the first clock signal line CLKA and the signal timing provided by the second clock signal line CLKB can adopt the signal timing as shown in FIG. 11A to implement the function of the gate drive circuit 10 to output the gate scan signals line by line.

It should be noted that in the embodiments of the present disclosure, a shift register unit B is a later shift register unit of another shift register unit A represents that the gate scan signal output by the shift register unit B is later in timing than the gate scan signal output by the shift register unit A. Correspondingly, a shift register unit B is an earlier shift register unit of another shift register unit A represents that the gate scan signal output by the shift register unit B is earlier in timing than the gate scan signal output by the shift register unit A. The following embodiments are the same as the embodiment and will not be described again.

Figure 9B:
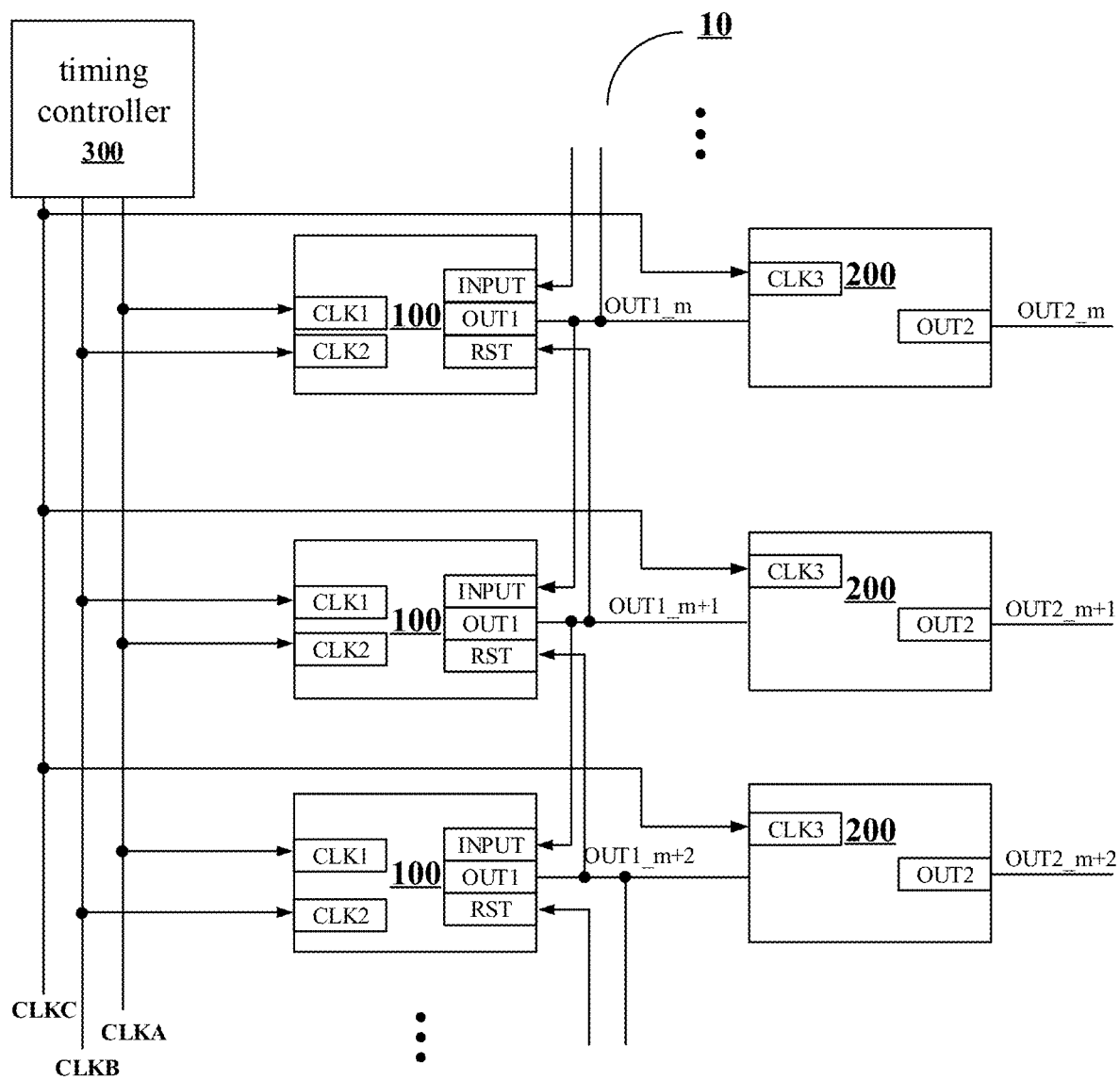
FIG. 9B is a schematic diagram of another example of a gate drive circuit provided by at least one embodiment of the disclosure.

At least one embodiment of the present disclosure further provides a gate drive circuit 10. As shown in FIG. 9B, on the basis of the example as shown in FIG. 9A, the gate drive circuit 10 further includes a second output circuit 200, a third signal line input terminal CLK3, and a seventh connection conductive portion (not shown in FIG. 9B). For example, a connection block diagram of the shift register unit 100 and the second output circuit 200 is shown in FIG. 10A. For example, the third signal line input terminal CLK3 can provide a third clock signal, the first voltage VGL or the second voltage VGH.

As shown in FIG. 10A, the second output circuit 200 is configured to output a third signal to the second output terminal OUT2 under control of the level output by the first output terminal OUT1. For example, the second output circuit 200 is connected to the first output terminal OUT1, the second output terminal OUT2 and the third signal line input terminal CLK3 to output the third signal to the second output terminal OUT2 under control of an effective level output by the first output terminal OUT1. For example, in a case where the shift register unit 100 includes the fourth connection conductive portion 4, the seventh connection conductive portion 7 connects the third signal line input terminal CLK3 and the second output circuit 200, and is configured to be in a layer different from the fourth connection conductive portion 4. For example, in a case where the fourth connection conductive portion 4 is in the fifth conductive layer 15 as shown in FIG. 4D, the seventh connection conductive portion 7 can be in the first data line layer (the fourth conductive layer 14) or other layers other than the layer where the fifth conductive layer 15 is located, so as to avoid that all of the plurality of connection conductive portions connecting respective transistors from being in a same layer, thereby simplifying the wiring design of the display panel and improving the accuracy of the transmission of signals. The embodiments of the present disclosure are not limited thereto.

For example, in another example, the second output circuit 200 can also be connected to the second node of the shift register unit 100 through the second connection conductive portion 2.

FIG. 10B shows a circuit structure schematic diagram of an example of the gate drive circuit as shown in FIG. 10A. As shown in FIG. 10B, in an example, on the basis of the circuit structure of the shift register unit as shown in FIG. 7, the gate drive circuit 10 further includes a seventh transistor, a third signal line input terminal, and a seventh connection conductive portion 7.

The second output circuit 200 can be implemented as a seventh transistor T7. For example, a gate electrode of the seventh transistor T7 is configured to be connected to the first output terminal OUT1 to receive the output signal of the shift register unit 100, a first electrode of the seventh transistor T7 is configured to be connected to the third signal line input terminal CLK3 to receive the third signal through the seventh connection conductive portion 7, and the second electrode of the seventh transistor T7 is configured to be connected to the second output terminal OUT2.

For example, in another example, the second output circuit 200 can further include an eighth transistor T8. For example, a gate electrode of the eighth transistor T8 is configured to be connected to the second node PD (i.e., the second electrode of the sixth transistor T6) in the shift register unit 100 through the second connection conductive portion 2, a first electrode of the eighth transistor T8 is configured to be connected to the second output terminal OUT2, and a second electrode of the eighth transistor T8 is configured to be connected to the first voltage terminal VGL to receive the first voltage.

It should be noted that the gate drive circuit provided by the embodiment of the present disclosure is not limited to the cascade mode as shown in FIG. 9B. The gate drive circuit can also cause the shift register units to be cascaded with each other by the second output terminal OUT2 of the second output circuit. The following embodiments are the same as the embodiment and will not be described again.

It should be noted that the second output circuit 200 can further include gate lines, data lines or other circuits, such as pixel circuits connected to the gate drive circuit, to achieve different functions, and the other circuit structures can also adopt the connection manners provided by the embodiments of the present disclosure, the embodiments of the present disclosure are not limited to this case.

For example, as shown in FIG. 9B, the gate drive circuit 10 further includes a third signal line CLKC. For example, the third signal line CLKC is connected to the third signal line input terminal CLK3 of the second output circuit 200.

For example, as shown in FIG. 9B, the timing controller 300 of the gate drive circuit 10 can also be configured to be connected to the third signal line CLKC to provide the third signal to the second output circuit 200. For example, in the example, the signal provided by the first signal line CLKA, the signal provided by the second signal line CLKB, and the signal provided by the third signal line CLKC can adopt the timing as shown in FIG. 11A to implement the function of the gate drive circuit 10 to output the gate scan signals line by line.

For example, as shown in FIG. 9B, OUT2_$m$ represents a second output terminal of an (m)th-stage of the second output circuit, OUT2_$m$+1 represents a second output terminal of an (m+1)th-stage of the second output circuit, and OUT2_$m$+2 represents a second output terminal of an (m+2)th-stage of the second output circuit.

Figure 9C:
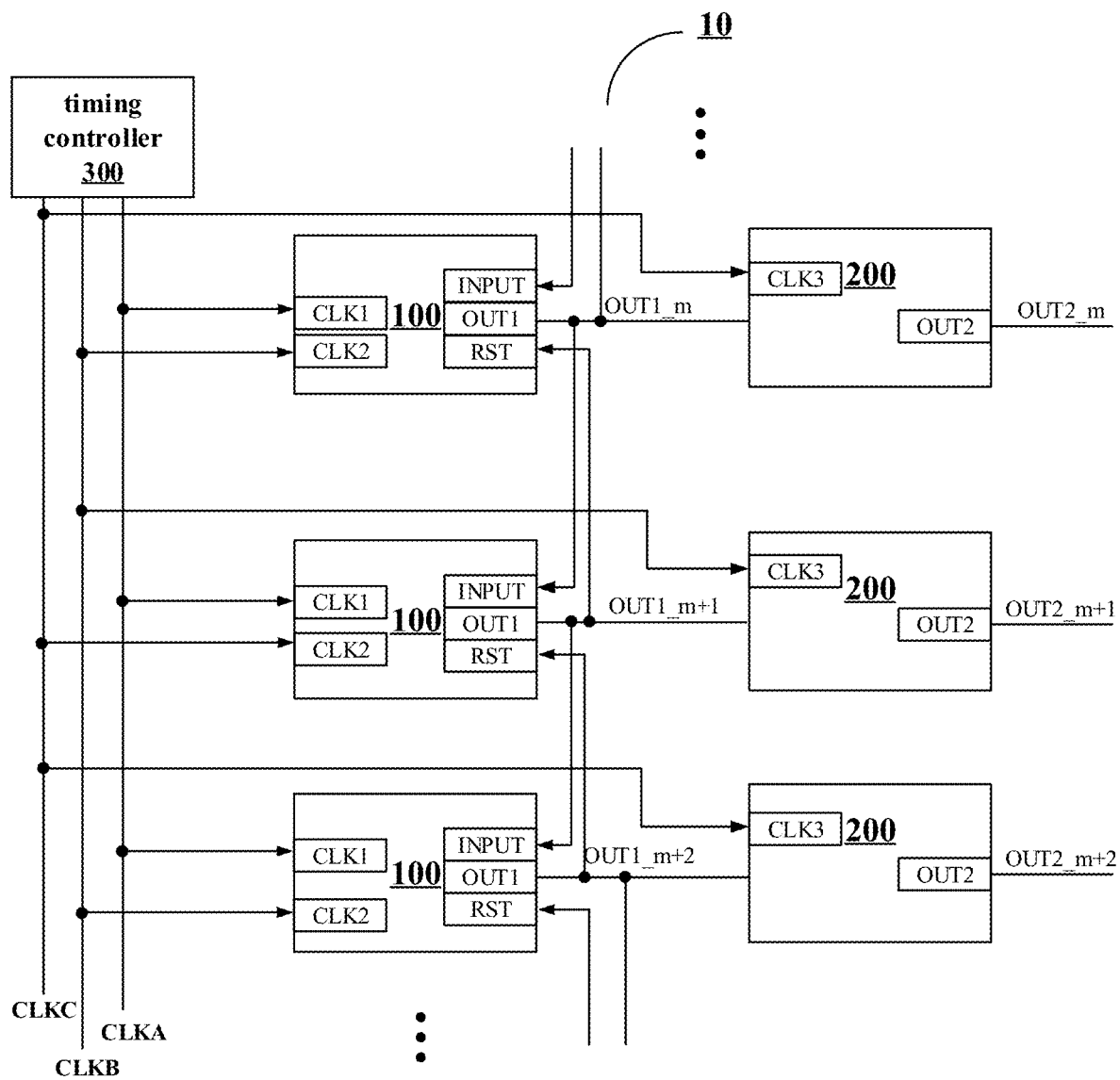
FIG. 9C is a schematic diagram of yet another example of a gate drive circuit provided by at least one embodiment of the disclosure.

At least one embodiment of the present disclosure further provides a gate drive circuit 10. As shown in FIG. 9C, the gate drive circuit 10 is similar to the gate drive circuit as shown in FIG. 9B except that the first signal provided by the first signal line CLKA is at a DC high level (e.g., the second voltage provided by the second voltage terminal).

For example, as shown in FIG. 9C, the first signal line input terminal CLK1 of each of the shift register units 100 is connected to the first signal line CLKA. For example, the second signal line CLKB is connected to a second signal line input terminal CLK2 of a (2m−1)th-stage (m is an integer greater than 0) of the shift register units, the third signal line CLKC is connected to a third signal line input terminal CLKC of a (2m−1)th-stage of the shift register units, the second signal line CLKB is connected to a third signal line input terminal CLKC of the (2m)th-stage of the shift register units, the third signal line CLKC is connected to the second signal line input terminal CLK2 of the (2m)th-stage (m is an integer greater than 0) of the shift register units, and embodiments of the present disclosure include but are not limited to this case.

Figure 11B:
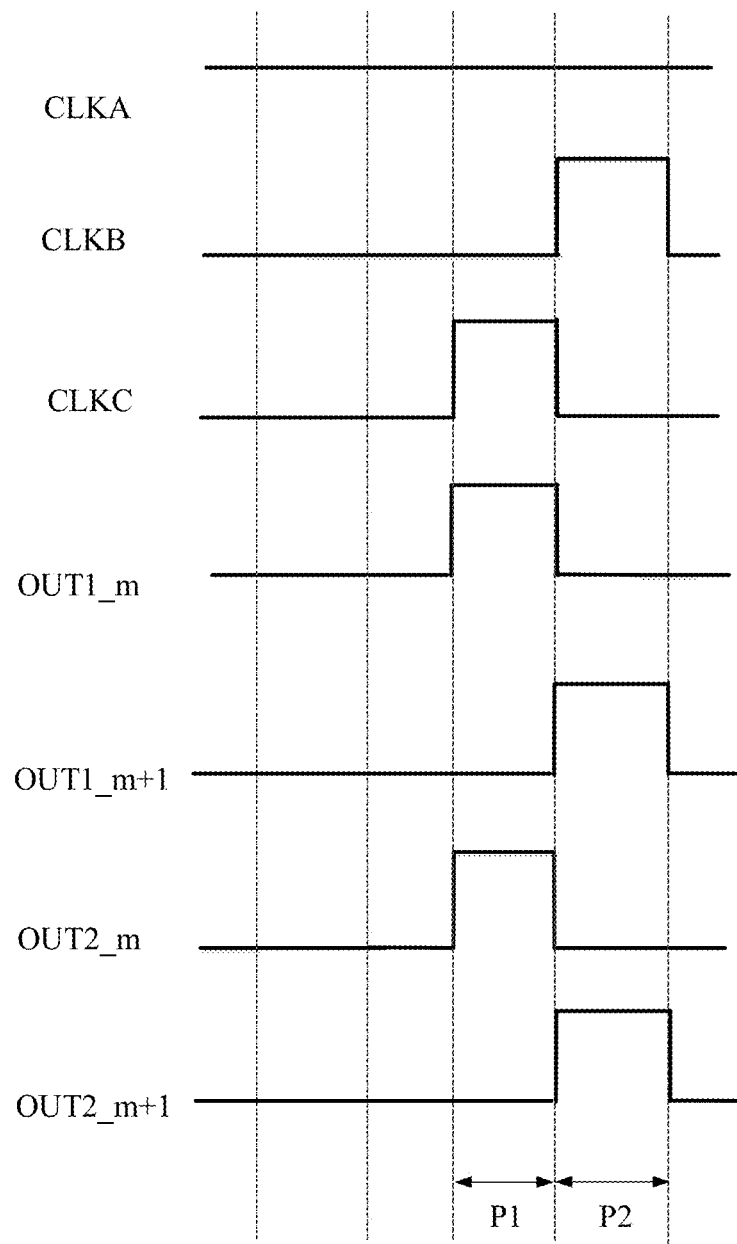
FIG. 11B is a signal timing chart corresponding to an operation process of the gate drive circuit as shown in FIG. 9C.

For example, in this example, the signal provided by the first signal line CLKA, the signal provided by the second signal line CLKB and the signal provided by the third signal line CLKC can adopt a signal timing as shown in FIG. 11B to implement the function of the gate drive circuit 10 to output the gate scan signals line by line.

Next, the operation principle of the gate drive circuit 10 as shown in FIG. 9B will be described with reference to the signal timing chart as shown in FIG. 11A, in FIG. 11A, an effective output level is a high level, and an ineffective output level is a low level. The first signal transmitted by the first signal line CLKA and the second signal transmitted by the second signal line CLKB are complementary to each other (e.g., opposite phases to each other), and the third signal transmitted by the third signal line CLKC is the same as the first signal transmitted by the first signal line CLKA in a first phase P1. In a first phase P1 and a second phase P2 as shown in FIG. 11A, the gate drive circuit 10 can perform the following operations respectively. Of course, the first signal and the second signal can also slightly overlap in timing.

In the first phase P1, the first signal line CLKA provides a high-level signal and the third signal line CLKC provides a high-level signal. Because the first signal line input terminal CLK1 of the (m)th-stage of the shift register units 100 is connected to the first signal line CLKA, the first signal line input terminal CLK1 of the (m)th-stage of the shift register units 100 inputs the high-level signal in the first phase P1. Because the first node PU of the (m)th-stage of the shift register units 100 is at a high level, the high-level signal input by the first signal line input terminal CLK1 is output to the first output terminal OUT1_*m* of the (m)th-stage of the shift register units 100 under control of the high level of the first node PU. Meanwhile, the second output circuit 200 is turned on under control of the high-level signal provided by the first output terminal OUT1_*m*, so that the second output terminal OUT2_*m* outputs the high-level signal provided by the third signal line CLKC. In the first phase P1, it should be noted that the level of potential in the signal timing chart as shown in FIG. 11A is only schematic and does not represent the true potential value or relative proportion. Corresponding to the above example, the high-level signal corresponding to an N-type transistor is a turned-on signal, while the low-level signal corresponding to an N-type transistor is a turned-off signal.

In the second phase P2, the second signal line CLKB provides a high-level signal, and the third signal line CLKC provides a high-level signal. Because the first signal line input terminal CLK1 of the (m+1)th-stage of the shift register units 100 is connected to the second signal line CLKB, the first signal line input terminal CLK1 of the (m+1)th-stage of the shift register units 100 inputs the high-level signal in this phase. Because the first node PU of the (m+1)th-stage of the shift register units 100 is at a high level, the high-level signal input by the first signal line input terminal CLK1 is output to the first output terminal OUT1_*m*+1 of the (m+1)th-stage of the shift register units 100 under control of the high level of the first node PU. Meanwhile, the second output circuit 200 is turned on under control of the high-level signal provided by the first output terminal OUT1_*m*+1, so that the second output terminal OUT2_*m*+2 outputs the high-level signal provided by the third signal line CLKC.

The operation principle of the gate drive circuit 10 as shown in FIG. 9C is similar to the operation principle of the gate drive circuit 10 as shown in FIG. 9B, and details will not be described here again.

Another embodiment of the present disclosure further provides a drive circuit, which includes a plurality of cascaded circuit structures, and the circuit structure can adopt the example as shown in FIG. 7 or the example as shown in FIG. 10B.

For example, as shown in FIG. 10B, on the basis of the circuit structure as shown in FIG. 7, the circuit structure can further include the seventh transistor, the third signal line input CLK3 and the seventh connection conductive portion 7. For example, a gate electrode of the seventh transistor T7 is configured to be connected to the first output terminal OUT1 to receive the output signal of the first output terminal, a first electrode of the seventh transistor T7 is configured to be connected to the third signal line input terminal CLK3 to receive a third signal through the seventh connection conductive portion 7, and the second electrode of the seventh transistor T7 is configured to be connected to the second output terminal OUT2. For example, in a case where the circuit structure includes the fourth connection conductive portion 4, the seventh connection conductive portion 7 is configured to be in a layer different from the fourth connection conductive portion 4.

For example, in another example, the circuit structure can further include the eighth transistor T8. For example, a gate electrode of the eighth transistor T8 is configured to be connected to the second node PD in the circuit structure through the second connection conductive portion 2, the first electrode of the eighth transistor T8 is configured to be connected to the second output terminal OUT2, and the second electrode of the eighth transistor T8 is configured to be connected to the first voltage terminal VGL to receive the first voltage.

For example, on the basis of the circuit structure as shown in FIG. 7, the drive circuit causes the earlier stage and the later stage to be cascaded with each other by the first output terminal OUT1. Based on the circuit structure as shown in FIG. 10B, the drive circuit can cause the earlier stage and the later stage to be cascaded with each other by the second output terminal OUT2.

It should be noted that the drive circuit is not limited to driving the shift register unit, but can also drive local area circuit other than the shift register unit. In addition, the drive circuit is not limited to supply a voltage to the gate line, and for example, at least one of a first light emission control line and a second light emission control line in a pixel circuit of OLED can be driven for providing a first light emission control signal and/or a second light emission control signal, etc. The pixel circuit is, for example, a pixel circuit with 8T2C.

For example, the drive circuit can also provide light emission control signals to pixels in two adjacent rows through the second output terminal OUT2.

Technical effects of the drive circuit provided by the embodiments of the present disclosure can refer to the corresponding description of the shift register unit 100 in the above embodiment, and will not be described here again.

Figure 12:
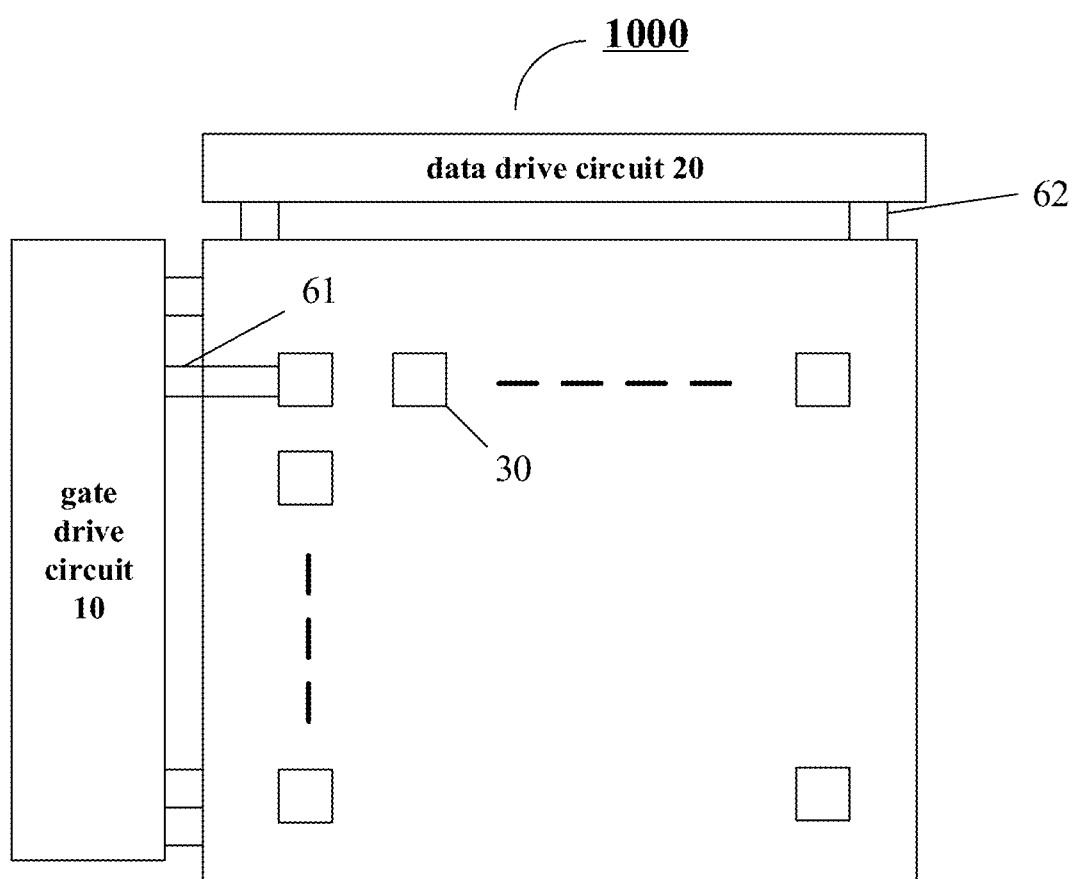
FIG. 12 is a schematic diagram of a display device provided by at least one embodiment of the disclosure.

At least one the embodiment of the present disclosure further provides a display device 1000. As shown in FIG. 12, the display device 1000 includes the gate drive circuit 10 or the drive circuit provided in the embodiments of the present disclosure. The display device 1000 includes a pixel array including a plurality of pixel units 30. For example, the display device 1000 can further include a data drive circuit 20. The data drive circuit 20 is configured to provide data signals to the pixel array; and the gate drive circuit 10 is configured to provide gate scan signals to the pixel array. The data drive circuit 20 is electrically connected to the pixel units 30 through the data lines 62. For example, the gate drive circuit 10 can be implemented as a GOA circuit, which is directly prepared on the array substrate of the display device and is electrically connected to the pixel units 30 through the gate lines 61.

For example, the gate drive circuit 10 or the drive circuit provided in the embodiment of the present disclosure included in the display device 1000 can be freely and flexibly disposed on the array substrate, for example, on at least one side of the flexible array substrate, for example, two sides, or four sides.

It should be noted that the display device 1000 provided by the embodiments of the present disclosure can be any product or component with display function such as a liquid crystal panel, a liquid crystal television, a display, an OLED panel, an OLED television, an electronic paper display device, a mobile phone, a tablet computer, a notebook computer, a digital photo frame, a navigator, etc. The display device 1000 can further include other conventional components such as a display panel, and the embodiments of the present disclosure are not limited thereto.

Technical effects of the display device 1000 provided by the embodiment of the present disclosure can refer to the corresponding descriptions of the gate drive circuit 10 in the above embodiment, and details are not described herein again.

It should be noted that not all structures of the display device 1000 are given for clarity and conciseness. In order to realize the necessary functions of the display device, those skilled in the art can set other structures not shown according to specific application scenarios, and embodiments of the present invention are not limited thereto.

What have been described above are only specific implementations of the present disclosure, the protection scope of the present disclosure is not limited thereto. The protection scope of the present disclosure should be based on the protection scope of the claims.

What is claimed is:

1. A shift register unit, comprising a substrate, an input circuit, a reset circuit, a first output circuit, a first output terminal, a first connection conductive portion connecting both the input circuit and the reset circuit, a second connection conductive portion connecting both the reset circuit and the first output circuit, and a third connection conductive portion connecting both the first output circuit and the first output terminal, and the input circuit, the reset circuit, the first output circuit, the first output terminal, the first connection conductive portion, the second connection conductive portion, and the third connection conductive portion are all on the substrate, wherein the input circuit is configured to control a level of a first node in response to an input signal;

the reset circuit is configured to reset the first node in response to a reset signal; and the first output circuit is configured to output a first signal to the first output terminal under control of the level of the first node, wherein the first connection conductive portion, the second connection conductive portion and the third connection conductive portion are in different layers, wherein the first electrode of the first output circuit and the second connection conductive portion are in a same layer; or a material of the first connection conductive portion is identical to a material of a semiconductor layer of the input circuit, wherein the shift register unit further comprises a second output circuit, a third signal line input terminal, a seventh connection conductive portion, and a fourth connection conductive portion, wherein a gate electrode of the second output circuit is configured to be connected to the first output terminal to receive an output signal output by the first output terminal, a first electrode of the second output circuit is configured to be connected to the third signal line input terminal through the seventh connection conductive portion to receive a third signal, and a second electrode of the second output circuit is configured to be connected to a second output circuit; and the seventh connection conductive portion is configured to be in a layer different from the fourth connection conductive portion.

2. The shift register unit according to claim 1, further comprising a first signal line input terminal and a fourth connection conductive portion, wherein the fourth connection conductive portion connects the first output circuit and the first signal line input terminal, and the fourth connection conductive portion is configured to be in a layer different from any two or three of the first connection conductive portion, the second connection conductive portion and the third connection conductive portion.

3. The shift register unit according to claim 2, further comprising an output noise reduction circuit and a fifth connection conductive portion, wherein the output noise reduction circuit is configured to perform noise reduction on the first output terminal under control of a level of a second node; and the fifth connection conductive portion connects the output noise reduction circuit and the first output circuit, and the fifth connection conductive portion is configured to be in a layer different from any two or three of the first connection conductive portion, the second connection conductive portion and the third connection conductive portion.

4. The shift register unit according to claim 3, further comprising a control circuit, a second signal line input terminal, and a sixth connection conductive portion, wherein the control circuit is configured to control the level of the second node under control of the level of the first node and/or a second signal; and the sixth connection conductive portion is configured to connect the control circuit and the second signal line input terminal, and the sixth connection conductive portion is in a layer different from the fourth connection conductive portion.

5. The shift register unit according to claim 1, wherein a length of the first connection conductive portion is less than a length of the second connection conductive portion; or the first signal comprises at least one of a clock signal, a voltage signal and a current signal.

6. A circuit structure, comprising a substrate, a first transistor, a second transistor, a third transistor, a storage capacitor, a first output terminal, a first connection conductive portion, a second connection conductive portion, and a third connection conductive portion, and the first transistor, the second transistor, the third transistor, the storage capacitor, the first output terminal, the first connection conductive portion, the second connection conductive portion, and the third connection conductive portion are all on the substrate, wherein the first connection conductive portion is configured to connect a first electrode of the first transistor and a first electrode of the second transistor;

the second connection conductive portion is configured to connect the first electrode of the second transistor, a gate electrode of the third transistor and a first electrode of the storage capacitor; and the third connection conductive portion is configured to connect the first output terminal and a first electrode of the third transistor, wherein the first connection conductive portion, the second connection conductive portion and the third connection conductive portion are in different layers, wherein the first electrode of the third transistor and the second connection conductive portion are in a same layer; or a material of the first connection conductive portion is identical to a material of a semiconductor layer of the first transistor, wherein the circuit structure further comprises a seventh transistor, a third signal line input terminal, a seventh connection conductive portion, and a fourth connection conductive portion, wherein a gate electrode of the seventh transistor is configured to be connected to the first output terminal to receive an output signal output by the first output terminal, a first electrode of the seventh transistor is configured to be connected to the third signal line input terminal through the seventh connection conductive portion to receive a third signal, and a second electrode of the seventh transistor is configured to be connected to a second output terminal; and the seventh connection conductive portion is configured to be in a layer different from the fourth connection conductive portion.

7. The circuit structure according to claim 6, further comprising a fourth transistor, a first signal line input terminal, a fourth connection conductive portion, and a fifth connection conductive portion, wherein the fourth connection conductive portion is configured to connect a second electrode of the third transistor and the first signal line input terminal, and the fourth connection conductive portion is in a layer different from any two or three of the first connection conductive portion, the second connection conductive portion and the third connection conductive portion; and the fifth connection conductive portion is configured to connect the first electrode of the third transistor and a first electrode of the fourth transistor, and the fifth connection conductive portion is in a layer different from any two or three of the first connection conductive portion, the second connection conductive portion and the third connection conductive portion.

8. The circuit structure according to claim 7, further comprising a fifth transistor, a sixth transistor, a second signal line input terminal, and a sixth connection conductive portion, wherein a first electrode of the fifth transistor is connected to a first electrode of the sixth transistor through the first connection conductive portion; and the sixth connection conductive portion is configured to connect a gate electrode of the sixth transistor and the second signal line input terminal, and the sixth connection conductive portion is in a layer different from the fourth connection conductive portion.

9. The circuit structure of claim 6, further comprising an eighth transistor, wherein a gate electrode of the eighth transistor is configured to be connected to a second node through the second connection conductive portion, a first electrode of the eighth transistor is configured to be connected to the second output terminal, and a second electrode of the eighth transistor is configured to be connected to a first voltage terminal to receive a first voltage.

10. A gate drive circuit, comprising a plurality of cascaded shift register units according to claim 1.

11. The gate drive circuit according to claim 10, further comprising a second output circuit, a third signal line input terminal, and a seventh connection conductive portion, wherein the second output circuit is configured to output a third signal to a second output terminal under control of a level output by the first output terminal; and the shift register unit further comprises a fourth connection conductive portion, the seventh connection conductive portion is configured to connect the third signal line input terminal and the second output circuit, and the seventh connection conductive portion is in a layer different from the fourth connection conductive portion.

12. A drive circuit, comprising a plurality of cascaded circuit structures according to claim 6.

13. A display device, comprising the gate drive circuit according to claim 12, wherein the gate drive circuit is on four sides of an array substrate.

14. The display device according to claim 13, further comprising a first conductive layer, a second conductive layer, a third conductive layer, a fourth conductive layer, a fifth conductive layer, and a sixth conductive layer, wherein a material of the first conductive layer is identical to a material of an active layer, a material of the second conductive layer is identical to a material of a first gate line layer, a material of the third conductive layer is identical to a material of a second gate line layer, a material of the fourth conductive layer is identical to a material of a first data line layer, a material of the fifth conductive layer is identical to a material of a second data line layer, and a material of the sixth conductive layer is identical to a material of a pixel electrode.

15. A display device, comprising the drive circuit according to claim 12,
   wherein the drive circuit is on four sides of an array substrate.

* * * * *